(12) United States Patent
Yoshitake et al.

(10) Patent No.: US 7,816,020 B2
(45) Date of Patent: Oct. 19, 2010

(54) ORGANIC ELECTROLUMINESCENT DEVICE

(75) Inventors: Osamu Yoshitake, Fukuoka (JP); Hiroshi Miyazaki, Fukuoka (JP); Toshihiro Yamamoto, Fukuoka (JP); Daisuke Suzaki, Kagawa (JP); Yu Yamada, Tokyo (JP); Sadao Kamimura, Kagawa (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 830 days.

(21) Appl. No.: 11/667,598

(22) PCT Filed: Nov. 25, 2004

(86) PCT No.: PCT/JP2004/017461

§ 371 (c)(1),
(2), (4) Date: May 11, 2007

(87) PCT Pub. No.: WO2006/057035

PCT Pub. Date: Jun. 1, 2006

(65) Prior Publication Data

US 2008/0093984 A1 Apr. 24, 2008

(51) Int. Cl.
*H01L 51/54* (2006.01)
(52) U.S. Cl. .................. 428/690; 313/504; 544/132
(58) Field of Classification Search .............. None
See application file for complete search history.

(56) References Cited

FOREIGN PATENT DOCUMENTS

| JP | 2001-230079 A | | 8/2001 |
|---|---|---|---|
| JP | 2002-352957 A1 | | 12/2002 |
| JP | 2003-109765 A1 | | 4/2003 |
| JP | 2004-146368 | * | 5/2004 |
| JP | 2004-146368 A | | 5/2004 |
| JP | 2004-331588 A | | 11/2004 |

OTHER PUBLICATIONS

English Translation of JP 2004-146368.*
Connell et. al., Polypyrazole . . . 1987, J. Of Polymer Science Part A, vol. 25, pp. 2531-2542.*

* cited by examiner

*Primary Examiner*—D. Lawrence Tarazano
*Assistant Examiner*—Gregory Clark
(74) *Attorney, Agent, or Firm*—Birch, Stewart, Kolasch & Birch LLP

(57) ABSTRACT

Provided is an organic electroluminescent device which is suitable for use in full-color and multicolor panels and shows higher luminous efficiency and better driving stability than organic electroluminescent devices utilizing luminescence from the singlet state. The organic electroluminescent device comprises a substrate 1 and an anode 2, organic layers, and a cathode 8 piled one upon another on the substrate, at least one of the organic layers comprises a light-emitting layer 5 containing a host material and a dopant material, and a compound having 2 to 4 pyrazole structures represented by the following formula I (wherein $Ar_4$ to $Ar_6$ are independently hydrogen or substituted or unsubstituted aromatic hydrocarbon groups or aromatic heterocyclic groups) is used as said host material.

7 Claims, 1 Drawing Sheet

ORGANIC ELECTROLUMINESCENT DEVICE

TECHNICAL FIELD

This invention relates to an organic electroluminescent device and, more particularly, to a thin-film device which emits light upon application of an electrical field to its organic light-emitting layer.

BACKGROUND TECHNOLOGY

In the development of electroluminescent devices utilizing organic materials (hereinafter referred to as organic EL device), the kind of electrodes has been optimized for the purpose of improving the electron-injecting efficiency from the electrode and a device in which a hole-transporting layer of an aromatic diamine and a light-emitting layer of 8-hydroxyquinoline aluminum complex are disposed as thin films between the electrodes has been developed (Appl. Phys. Lett., Vol. 51, p. 913, 1987) to bring about a noticeable improvement in luminous efficiency over the conventional devices utilizing single crystals of anthracene and the like. Following this, the developmental works of organic El devices have been focused on their commercial applications to high-performance flat panels characterized by self luminescence and high-speed response.

In order to improve the efficiency of such organic EL devices still further, various modifications of the aforementioned basic structure of anode/hole-transporting layer/light-emitting layer/cathode have been tried by suitably adding a hole-injecting layer, an electron-injecting layer, and an electron-transporting layer. For example, the following structures are known: anode/hole-injecting layer/hole-transporting layer/light-emitting layer/cathode; anode/hole-injecting layer/light-emitting layer/electron-transporting layer/cathode; and anode/hole-injecting layer/light-emitting layer/electron-transporting layer/electron-injecting layer/cathode. The hole-transporting layer has a function of transporting the holes injected from the hole-injecting layer to the light-emitting layer while the electron-transporting layer has a function of transporting the electrons injected from the cathode to the light-emitting layer.

The interposition of the hole-transporting layer between the light-emitting layer and the hole-injecting layer helps to inject more holes to the light-emitting layer by application of lower electrical field and, furthermore, the electrons injected into the light-emitting layer from the cathode or from the electron-transporting layer accumulate in the interface between the hole-transporting layer and the light-emitting layer as the hole-transporting layer obstructs the flow of electrons. As a result, the luminous efficiency improves.

Likewise, the interposition of the electron-transporting layer between the light-emitting layer and the electron-injecting layer helps to inject more electrons into the light-emitting layer by application of lower electrical field and, furthermore, the holes injected into the light-emitting layer from the anode or from the hole-transporting layer accumulate in the interface between the electron-transporting layer and the light-emitting layer as the electron-transporting layer obstructs the flow of holes. As a result, the luminous efficiency improves.

A large number of organic materials conforming to the function of these layered structures have been developed.

The aforementioned device comprising a hole-transporting layer of an aromatic diamine and a light-emitting layer of 8-hydroxyquinoline aluminum complex and many others utilize fluorescence. Now, the utilization of phosphorescence, that is, emission of light from the triplet excited state, is expected to enhance the luminous efficiency approximately three times that of the conventional devices utilizing fluorescence (singlet). To achieve this object, studies had been conducted on the use of coumarin derivatives and benzophenone derivatives in the light-emitting layer, but the result was nothing but extremely low luminance. Thereafter, the use of europium complexes was attempted, but it failed to produce high luminous efficiency.

The prior technical documents relating to this invention are listed below.

Patent reference 1: JP2002-352957 A
Patent reference 2: JP2001-230079 A
Patent reference 3: JP2003-109765 A
Patent reference 4: JP2001-313178 A
Patent reference 5: JP2003-45611 A
Patent reference 6: JP2002-158091 A
Non-patent reference 1: Nature, Vol. 395, p. 151, 1998
Non-patent reference 2: Appl. Phys. Lett., Vol. 75, p. 4, 1999

The possibility of emitting red light at high efficiency by the use of a platinum complex (T-1, PtOEP) is reported in the aforementioned non-patent reference 1. Since then, it is reported in the non-patent reference 2 that the efficiency of emitting green light has been improved markedly by doping the light-emitting layer with iridium complexes (T-2, Ir(ppy)$_3$). It is reported further that optimization of the light-emitting layer enables these iridium complexes to show extremely high luminous efficiency even when the structure of a device is simplified (Appl. Phys. Lett., Vol. 77, p. 904, 2000).

In applying organic El devices to display devices such as flat panel displays, it is necessary to improve the luminous efficiency and at the same time to secure the driving stability. However, the organic EL devices utilizing the phosphorescent molecule (T-2) described in the non-patent reference 2, although highly efficient, are not suitable for practical use because of their insufficient driving stability at the present time (Jpn. J. Appl. Phys., Vol. 38, p. L1502, 1999).

The main cause of the aforementioned deterioration of the driving stability is presumed to be the deterioration of the shape of thin film of the light-emitting layer in a device having a structure of substrate/anode/hole-transporting layer/light-emitting layer/hole-blocking layer/electron-transporting layer/cathode or substrate/anode/hole-transporting layer/light-emitting layer/electron-transporting layer/cathode. It is likely that the deterioration of the shape of thin film is attributable to crystallization (or cohesion) of thin organic amorphous films caused by generation of heat during driving of the device and low heat resistance is due to low glass transition temperature (Tg) of the material in use.

A carbazole compound (H-1, CBP) or a triazole compound (H-2, TAZ) is used in the light-emitting layer and a phenanthroline derivative (HB-1) is used in the hole-blocking layer in the non-patent reference 2. Because of their high symmetry and low molecular weight, these compounds readily undergo crystallization or cohesion and suffer deterioration in the shape of thin film. Besides, their crystallinity is too high to allow observation of the Tg. Such instability of the shape of thin film in the light-emitting layer adversely affects the performance of a device, for example, by shortening the driving life and lowering the heat resistance. For the reasons described above, a difficult problem facing phosphorescent organic electroluminescent devices at the present time is their driving stability.

It is disclosed in the patent reference 1 that a compound containing an oxadiazolyl group is used as a host material in an organic EL device comprising a host material and a phosphorescent dopant material in its light-emitting layer. An organic EL device comprising a thiazole or pyrazole structure in its organic layer is disclosed in the patent reference 2. An organic EL device comprising a pyrazole compound or a pyrazoline compound in its organic layer is disclosed in the patent reference 3. An organic EL device comprising a phosphorescent iridium complex and a carbazole compound in its light-emitting layer is disclosed in the patent reference 4. An organic EL device comprising a carbazole compound (PVK), a compound containing an oxadiazolyl group (PBD), and an iridium complex (Ir(ppy)$_3$) in its light-emitting layer is disclosed in the patent reference 5. Ortho-metalated metal complexes and porphyrin metal complexes are proposed as phosphorescent compounds in the patent reference 6. However, they also face the aforementioned problem. It is to be noted that the patent references 2 and 3 disclose no organic EL devices utilizing phosphorescence.

DISCLOSURE OF THE INVENTION

Problems to be Solved by the Invention

Improvement of the driving stability and heat resistance of organic EL devices is an essential requirement when their application to display devices such as flat panel displays and illuminating devices are considered and an object of this invention is to provide an organic EL device which performs at high efficiency with good driving stability.

Means to Solve the Problems

As a result of their intensive studies, the inventors of this invention have found that the aforementioned problems can be solved by using specified compounds in the light-emitting layer or the hole-blocking layer and completed this invention.

Accordingly, this invention relates to an organic electroluminescent device comprising an anode, organic layers, and a cathode piled one upon another on a substrate wherein at least one of the organic layers is a light-emitting layer containing a host material and a dopant material and a compound containing 2 to 4 pyrazole structures represented by the following formula I in the same molecule is used as said host material;

[Chem 1]

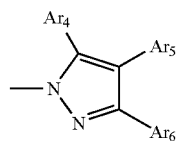

(I)

in formula I, Ar$_4$ to Ar$_6$ are independently hydrogen or substituted or unsubstituted aromatic hydrocarbon groups or aromatic heterocyclic groups and at least one of them is a group other than hydrogen.

A compound represented by the following formula II is preferable as a compound containing 2 to 4 pyrazole structures.

[Chem 2]

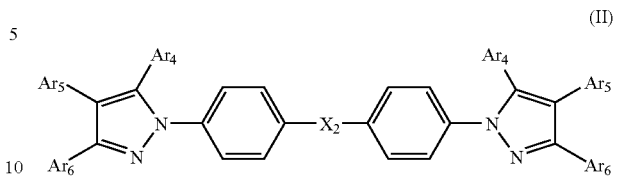

(II)

In formula II, Ar$_4$ to Ar$_6$ are independently hydrogen or substituted or unsubstituted aromatic hydrocarbon groups or aromatic heterocyclic groups and at least one of them is a group other than hydrogen and X$_2$ is a direct bond, —O—, —S—, >CO, >SO$_2$, >NAr$_7$, or >SiAr$_8$Ar$_9$ with Ar$_7$ to Ar$_9$ denoting substituted or unsubstituted aromatic hydrocarbon groups or aromatic heterocyclic groups.

A dopant material preferably contains at least one metal complex selected from phosphorescent ortho-metalated metal complexes and porphyrin metal complexes. Furthermore, organic metal complexes containing at least one metal selected from groups 7 to 11 of the periodic table as their central metal are preferable. Preferred examples of the metals to be selected from groups 7 to 11 of the periodic table are ruthenium, rhodium, palladium, silver, rhenium, osmium, iridium, platinum, and gold.

An organic electroluminescent device of this invention preferably comprises a hole-blocking layer and/or an electron-transporting layer between the light-emitting layer and the cathode.

An organic electroluminescent device (organic EL device) of this invention will be described further below.

An organic EL device of this invention comprises organic layers at least one of which is a light-emitting layer between an anode and a cathode provided on a substrate; the light-emitting layer contains a specified host material and a specified phosphorescent dopant material and normally the host material constitutes the primary component and the dopant material the secondary component.

The primary component here means a component which accounts for 50 wt % or more of the materials constituting the layer in question while the secondary component means the rest of the materials. A compound to be selected for the host material has an excited triplet level higher in energy than that of a compound to be selected for the phosphorescent dopant material.

A compound to be incorporated as a host material in the light-emitting layer of this invention is required to form a thin film of stable shape, have a high glass transition temperature (Tg), and transport holes and/or electrons efficiently. Further, the compound is required to be electrochemically and chemically stable and disinclined to generate impurities that become traps or quench emitted light during its preparation or use. As a compound to satisfy these requirements, use is made of one kind or more of compounds containing 2 to 4 pyrazole structures represented by the aforementioned formula I (hereinafter referred to as a pyrazole-derived compound) in the same molecule.

A pyrazole-derived compound to be used as a host material contains 2 to 4, preferably 2 to 3, pyrazole structures represented by the aforementioned formula I. In formula I, Ar$_4$ to Ar$_6$ are independently substituted or unsubstituted aromatic hydrocarbon groups or aromatic heterocyclic groups. Aryl groups such as phenyl and naphthyl are preferable as aromatic hydrocarbon groups while heteroaryl group such as pyridyl and quinolyl are preferable as aromatic heterocyclic groups. These groups may be substituted and the substituent groups include lower alkyl groups of 1 to 6 carbon atoms such as methyl and ethyl, aryl groups of 6 to 12 carbon atoms such as phenyl and methylphenyl, and heteroaryl groups such as pyridyl, diazolyl, and triazolyl.

One of the requirements a host material must satisfy in order to form a thin film of stable shape is an adequate molecular weight and the presence of 2 or more pyrazole structures is desirable to satisfy this requirement. A host material is usually formed into film by vacuum deposition and an organic compound having a larger molecular weight than is necessary requires excessive energy in vacuum deposition and decomposition occurs in preference to evaporation. For this reason, the number of pyrazole structures is preferably 4 at most.

On the other hand, suppression of crystallinity is also an important condition to form a thin film of stable shape. The crystallinity of organic compounds is considered to be controlled by the symmetry (planarity) of molecular structure, the interaction of molecules containing polar groups, and the like. When a pyrazole-derived compound of this invention is used, an aromatic group present at the position 3, 4, or 5 of the pyrazole ring prevents the molecule from forming a planar structure and suppresses crystallinity. Furthermore, arranging bulky aromatic groups around a highly polar nitrogen atom produces an effect to control the intramolecular interaction.

Preferred examples of $Ar_4$ to $Ar_6$ are hydrogen or aromatic hydrocarbon groups containing 1 to 3 rings and the aromatic groups may be substituted preferably with lower alkyl groups of 1 to 5 carbon atoms. Concretely, preferred aromatic hydrocarbon groups include phenyl, 2-methylphenyl, 3-methylphenyl, 4-methylphenyl, 2,4-dimethylphenyl, 3,4-dimethylphenyl, 2,4,5-trimethylphenyl, 4-ethylphenyl, 4-tert-butylphenyl, 1-naphthyl, 2-naphthyl, 1-anthracenyl, 2-anthracenyl, 9-anthracenyl, and 9-phenanthrenyl. The groups $Ar_4$ to $Ar_6$ may be identical with or different from one another. Two or more of $Ar_4$ to $Ar_6$ are preferably groups other than hydrogen and, in particular, $Ar_4$ and $Ar_6$ are groups other than hydrogen.

Any of the compounds represented by the aforementioned formula II is preferable as a pyrazole-derived compound. In formula II, the earlier description of $Ar_4$ to $Ar_6$ holds true here, but they can vary mutually independently.

The group $X_2$ in general formula II is a divalent linking group and it is a direct bond, —O—, —S—, >CO, >$SO_2$, >$NAr_7$, >$SiAr_8Ar_9$, or a divalent aromatic hydrocarbon group.

Here, $Ar_7$ to $Ar_9$ are substituted or unsubstituted aromatic hydrocarbon groups or aromatic heterocyclic groups preferably containing 1 to 3 rings and they may be substituted. Preferred substituent groups include lower alkyl groups of 1 to 6 carbon atoms such as methyl and ethyl, aryl groups of 6 to 12 carbon atoms such as phenyl and methylphenyl, and heteroaryl groups such as pyridyl, diazolyl, and triazolyl and further include a substituent containing 1 to 2 of the aforementioned pyrazole structures. The number of substituents is preferably in the range of 0 to 3.

In the case where $Ar_7$ to $Ar_9$ are substituted or unsubstituted aromatic hydrocarbon groups, they are preferably substituted or unsubstituted aryl groups such as phenyl, naphthyl, methylphenyl, pyridylphenyl, methylnaphthyl, and phenylnaphthyl and their concrete examples are phenyl, 2-methylphenyl, 3-methylphenyl, 4-methylphenyl, 4-(4-pyridyl)phenyl, 4-(3,5-diphenyl-1-pyrazolyl)phenyl, 4-(3,4,5-triphenyl-1-pyrazolyl)phenyl, 2-naphthyl, 2-(5-phenyl)naphthyl, 1-anthracenyl, 2-anthracenyl, 9-anthracenyl, 9-phenanthrenyl, and biphenylyl.

In the case where $Ar_7$ to $Ar_9$ are substituted or unsubstituted aromatic heterocyclic groups, they are preferably substituted or unsubstituted heteroaryl groups such as pyridyl, diazolyl, and triazolyl and their concrete examples are thienyl, furyl, pyrrolyl, imidazolyl, pyrazolyl, oxazolyl, thiazolyl, pyridyl, pyrazinyl, pyrimidinyl, pyridazinyl, indolyl, quinolyl, isoquinolyl, phthalazinyl, quinoxanyl, quinazolinyl, carbazolyl, acridinyl, phenazinyl, furfuryl, isothiazolyl, isoxazolyl, furazanyl, phenoxadinyl, benzothienyl, benzothiazolyl, benzoxazolyl, benzimidazolyl, methylpyridyl, and cyanopyridyl.

In the case where $X_2$ is a divalent aromatic hydrocarbon group in the aforementioned general formula II, it is preferably a divalent group such as 1,4-phenylene, 1,4-naphthylene, 9,10-anthracenylene, and 4,4'-biphenylene.

The compounds represented by formula II are exemplified concretely in Tables 1 to 14, but they are not limited to these examples. The groups $X_2$, $Ar_4$, $Ar_5$, and $Ar_6$ in these tables correspond to those defined in formula II. Where $X_2$ is designated as —, it is a direct bond (single bond).

TABLE 1

| | $X_2$ | $Ar_4$ | $Ar_5$ | $Ar_6$ |
|---|---|---|---|---|
| 101 | — | phenyl | H | phenyl |
| 102 | — | naphthyl | H | phenyl |
| 103 | — | biphenyl | H | phenyl |

TABLE 1-continued

| | $X_2$ | $Ar_4$ | $Ar_5$ | $Ar_6$ |
|---|---|---|---|---|
| 104 | — | phenyl | phenyl | phenyl |
| 105 | — | 2-naphthyl | phenyl | phenyl |
| 106 | — | 4-biphenyl | phenyl | phenyl |
| 107 | — | phenyl | H | 2-naphthyl |
| 108 | — | 2-naphthyl | H | 2-naphthyl |
| 109 | — | 4-biphenyl | H | 2-naphthyl |
| 110 | — | phenyl | phenyl | 2-naphthyl |
| 111 | — | 2-naphthyl | phenyl | 2-naphthyl |
| 112 | — | 4-biphenyl | phenyl | 2-naphthyl |
| 113 | — | phenyl | H | 1-naphthyl |
| 114 | — | 2-naphthyl | H | 1-naphthyl |

TABLE 1-continued

| | X₂ | Ar₄ | Ar₅ | Ar₆ |
|---|---|---|---|---|
| 115 | — | 4-biphenylyl | H | 1-naphthyl |

TABLE 2

| | X₂ | Ar₄ | Ar₅ | Ar₆ |
|---|---|---|---|---|
| 116 | — | phenyl | phenyl | 1-naphthyl |
| 117 | — | 2-naphthyl | phenyl | 1-naphthyl |
| 118 | — | 4-(4-biphenylyl)phenyl | | 1-naphthyl |
| 119 | N,N-dimethylaminophenyl | phenyl | H | phenyl |
| 120 | N,N-dimethylaminophenyl | 2-naphthyl | H | phenyl |
| 121 | N,N-dimethylaminophenyl | 4-biphenylyl | H | phenyl |
| 122 | N,N-dimethylaminophenyl | phenyl | phenyl | phenyl |
| 123 | N,N-dimethylaminophenyl | 2-naphthyl | phenyl | phenyl |
| 125 | N,N-dimethylaminophenyl | phenyl | H | 2-naphthyl |
| 126 | N,N-dimethylaminophenyl | 2-naphthyl | H | 2-naphthyl |

TABLE 2-continued

| | X₂ | Ar₄ | Ar₅ | Ar₆ |
|---|---|---|---|---|
| 127 | phenyl-N(CH₃)- | 4-biphenyl | H | 2-naphthyl |
| 128 | phenyl-N(CH₃)- | phenyl | | 4-(2-naphthyl)phenyl |
| 129 | phenyl-N(CH₃)- | 2-naphthyl | | 4-(2-naphthyl)phenyl |
| 130 | phenyl-N(CH₃)- | 4-(4'-biphenyl)phenyl | | 2-naphthyl |
| 131 | phenyl-N(CH₃)- | phenyl | H | 3-pyridyl |

TABLE 3

| | X₂ | Ar₄ | Ar₅ | Ar₆ |
|---|---|---|---|---|
| 132 | phenyl-N(CH₃)- | 2-naphthyl | H | 3-pyridyl |
| 133 | phenyl-N(CH₃)- | 4-biphenyl | H | 3-pyridyl |
| 134 | phenyl-N(CH₃)- | phenyl | phenyl | 3-pyridyl |
| 135 | phenyl-N(CH₃)- | 2-naphthyl | phenyl | 3-pyridyl |
| 136 | phenyl-N(CH₃)- | 4-biphenyl | phenyl | 3-pyridyl |
| 137 | (2-methylphenyl)-N(CH₃)- | phenyl | H | phenyl |

TABLE 4

| | X₂ | Ar₄ | Ar₅ | Ar₆ |
|---|---|---|---|---|
| 138 | 2-methyl-N,N-dimethylaniline | phenyl | phenyl | phenyl |
| 139 | 4-biphenyl-N-methyl-N-phenylamino | phenyl | H | phenyl |
| 140 | 4-biphenyl-N-methyl-N-phenylamino | phenyl | phenyl | phenyl |
| 141 | 2,2'-dimethyl-4-biphenyl-N-methyl-N-benzylamino | phenyl | H | phenyl |
| 142 | 2,2'-dimethyl-4-biphenyl-N-methyl-N-benzylamino | phenyl | phenyl | phenyl |

TABLE 5

| | X₂ | Ar₄ | Ar₅ | Ar₆ |
|---|---|---|---|---|
| 143 | 4-(2-pyridyl)-N,N-dimethylaniline | phenyl | H | phenyl |
| 144 | 4-(2-pyridyl)-N,N-dimethylaniline | phenyl | phenyl | phenyl |
| 145 | 4-(3-pyridyl)-N,N-dimethylaniline | phenyl | H | phenyl |
| 146 | 4-(3-pyridyl)-N,N-dimethylaniline | phenyl | phenyl | phenyl |
| 147 | 4-(4-pyridyl)-N,N-dimethylaniline | phenyl | H | phenyl |
| 148 | 4-(4-pyridyl)-N,N-dimethylaniline | phenyl | phenyl | phenyl |

TABLE 5-continued
| | X$_2$ | Ar$_4$ | Ar$_5$ | Ar$_6$ |
|---|---|---|---|---|
| 149 | 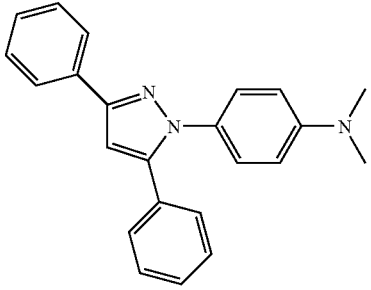 | 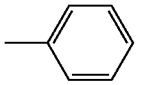 | H | 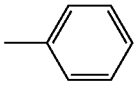 |
| 150 | 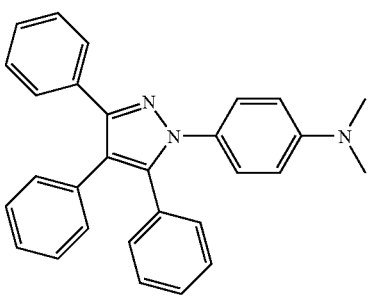 | 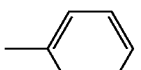 | H | 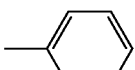 |
| 151 | 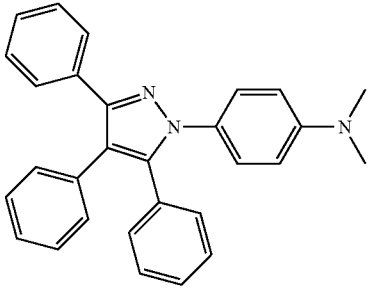 | 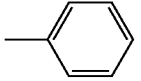 | 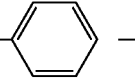 | 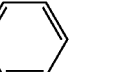 |
| 152 | 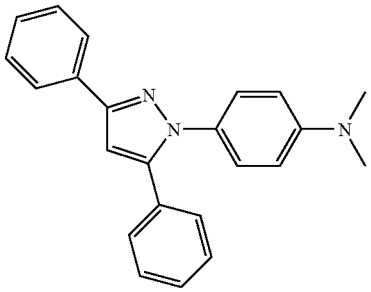 | 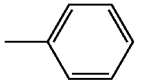 | 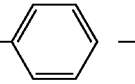 | 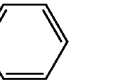 |

In the case where a compound is represented by formula II wherein $X_2$ is $>SiAr_8Ar_9$ and $Ar_8$ and $Ar_9$ are substituted or unsubstituted aromatic hydrocarbon groups, preferred examples of such a compound are shown in Table 6.

TABLE 6

| | $Ar_4$ | $Ar_5$ | $Ar_6$ | $Ar_8$ | $Ar_9$ |
|---|---|---|---|---|---|
| 153 | phenyl | H | phenyl | phenyl | phenyl |
| 154 | phenyl | phenyl | phenyl | phenyl | phenyl |
| 155 | phenyl | H | phenyl | 4-CH$_3$-phenyl | 4-CH$_3$-phenyl |
| 156 | phenyl | phenyl | phenyl | 4-CH$_3$-phenyl | 4-CH$_3$-phenyl |
| 157 | phenyl | H | phenyl | phenyl | 4-CH$_3$-phenyl |
| 158 | phenyl | H | phenyl | 4-OCH$_3$-phenyl | 4-OCH$_3$-phenyl |
| 159 | phenyl | phenyl | phenyl | 4-OCH$_3$-phenyl | 4-OCH$_3$-phenyl |
| 160 | phenyl | H | phenyl | phenyl | 4-OCH$_3$-phenyl |
| 161 | phenyl | H | phenyl | biphenyl | quinquephenyl |
| 162 | phenyl | phenyl | phenyl | biphenyl | quinquephenyl |
| 163 | phenyl | H | phenyl | phenyl | biphenyl |

In the case where a compound is represented by formula II wherein $X_2$ is >$NAr_7$ and $Ar_7$ is a substituted or unsubstituted aromatic heterocyclic group, preferred examples of such a compound are shown in Tables 7 to 12.
TABLE 7
| | $Ar_4$ | $Ar_5$ | $Ar_6$ | $Ar_7$ |
|---|---|---|---|---|
| 164 | 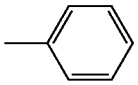 | H | 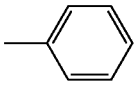 |  |
| 165 | 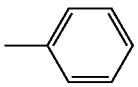 | H | 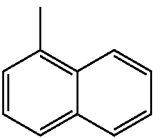 |  |
| 166 | 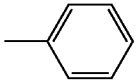 | H | 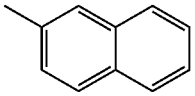 |  |
| 167 | 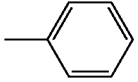 | 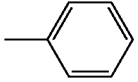 | 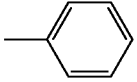 |  |
| 168 | 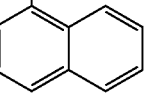 | H | 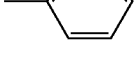 |  |
| 169 | 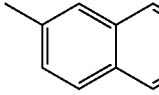 | H | 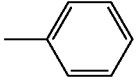 |  |
| 170 | 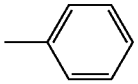 | H | 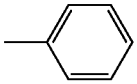 |  |
| 171 | 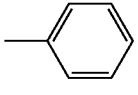 | H | 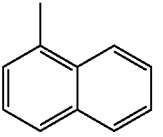 |  |
| 172 | 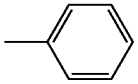 | H | 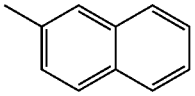 |  |
| 173 | 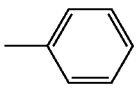 | 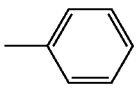 | 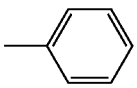 |  |
| 174 | 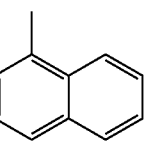 | H | 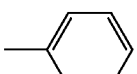 |  |

TABLE 7-continued
| | Ar₄ | Ar₅ | Ar₆ | Ar₇ |
|---|---|---|---|---|
| 175 | 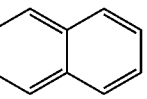 | H | 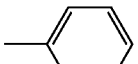 | 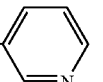 |
| 176 | 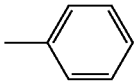 | H | 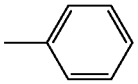 | 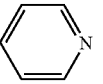 |
TABLE 8
| | Ar₄ | Ar₅ | Ar₆ | Ar₇ |
|---|---|---|---|---|
| 177 | 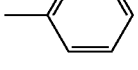 | H | 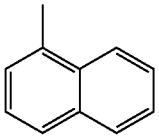 | 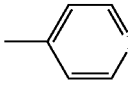 |
| 178 | 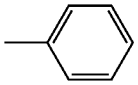 | H | 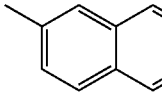 | 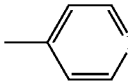 |
| 179 | 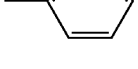 | 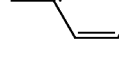 | 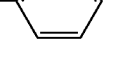 | 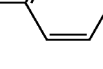 |
| 180 | 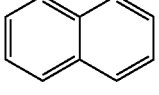 | H | 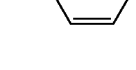 | 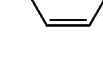 |
| 181 | 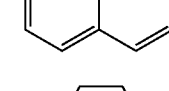 | H | 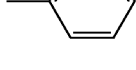 | 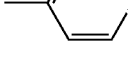 |
| 182 | 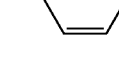 | H | 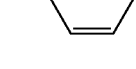 | 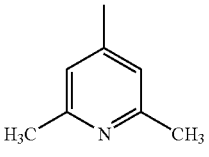 |
| 183 | 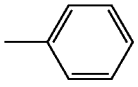 | H | 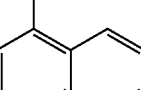 | 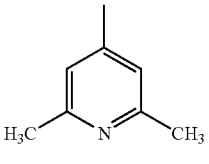 |
| 184 | 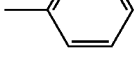 | H | 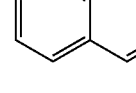 | 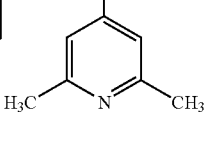 |

TABLE 8-continued
| | Ar₄ | Ar₅ | Ar₆ | Ar₇ |
|---|---|---|---|---|
| 185 | 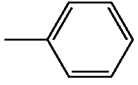 | 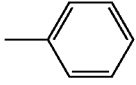 | 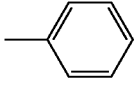 | 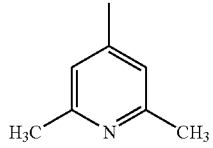 |
| 186 | 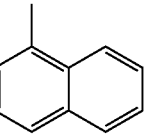 | H | 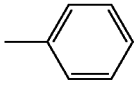 | 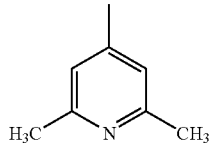 |
| 187 | 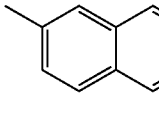 | H | 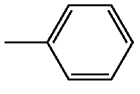 | 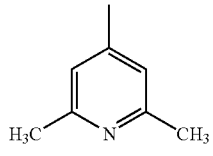 |
TABLE 9
| | Ar₄ | Ar₅ | Ar₆ | Ar₇ |
|---|---|---|---|---|
| 188 | 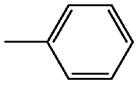 | H | 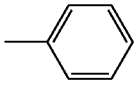 | 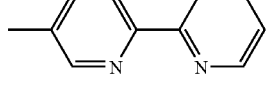 |
| 189 | 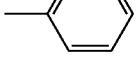 | H | 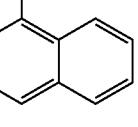 | 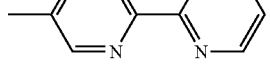 |
| 190 | 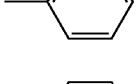 | H | 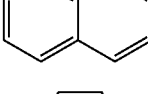 | 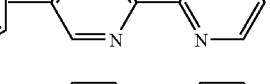 |
| 191 | 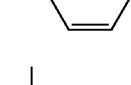 | 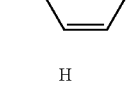 | 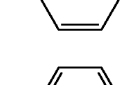 | 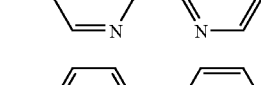 |
| 192 | 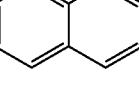 | H | 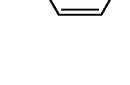 | 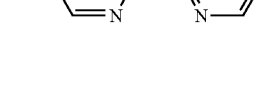 |
| 193 | 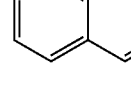 | H | 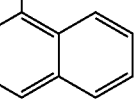 | 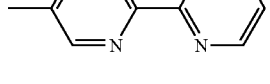 |
| 194 | 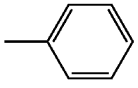 | H | 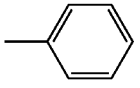 |  |

TABLE 9-continued
| | Ar₄ | Ar₅ | Ar₆ | Ar₇ |
|---|---|---|---|---|
| 195 | 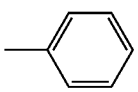 | H | 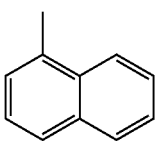 | 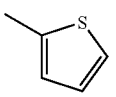 |
| 196 | 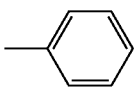 | H | 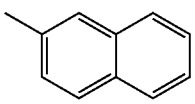 | 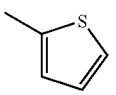 |
| 197 | 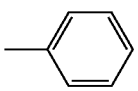 | 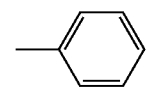 |  | 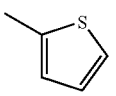 |
| 198 | 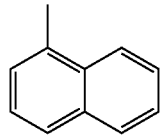 | H | 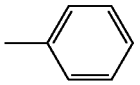 | 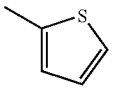 |
| 199 | 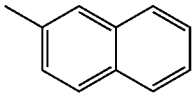 | H | 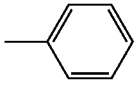 | 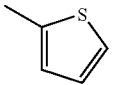 |
| 200 | 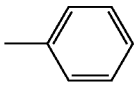 | H | 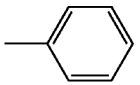 | 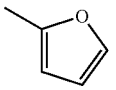 |
TABLE 10
| | Ar₄ | Ar₅ | Ar₆ | Ar₇ |
|---|---|---|---|---|
| 201 | 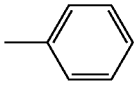 | H | 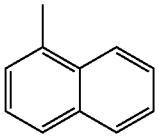 | 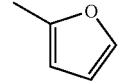 |
| 202 | 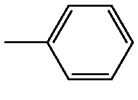 | H | 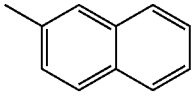 | 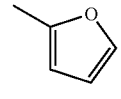 |
| 203 | 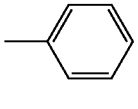 | 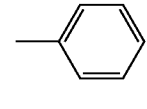 |  | 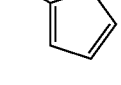 |
| 204 | 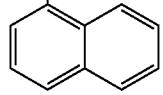 | H | 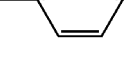 | 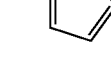 |
| 205 | 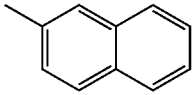 | H | 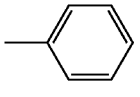 | 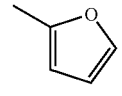 |

TABLE 10-continued

| | Ar₄ | Ar₅ | Ar₆ | Ar₇ |
|---|---|---|---|---|
| 206 | phenyl | H | phenyl | pyrimidin-2-yl |
| 207 | phenyl | H | naphthalen-1-yl | pyrimidin-2-yl |
| 208 | phenyl | H | naphthalen-2-yl | pyrimidin-2-yl |
| 209 | phenyl | phenyl | phenyl | pyrimidin-2-yl |
| 210 | naphthalen-1-yl | H | phenyl | pyrimidin-2-yl |
| 211 | naphthalen-2-yl | H | phenyl | pyrimidin-2-yl |
| 212 | phenyl | H | phenyl | 4,6-diphenyl-1,3,5-triazin-2-yl |

TABLE 11

| | Ar₄ | Ar₅ | Ar₆ | Ar₇ |
|---|---|---|---|---|
| 213 | phenyl | H | naphthalen-1-yl | 4,6-diphenyl-1,3,5-triazin-2-yl |
| 214 | phenyl | H | naphthalen-2-yl | 4,6-diphenyl-1,3,5-triazin-2-yl |

TABLE 11-continued
| | Ar₄ | Ar₅ | Ar₆ | Ar₇ |
|---|---|---|---|---|
| 215 | 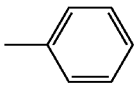 | 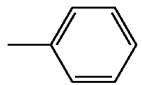 | 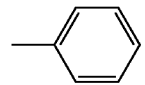 | 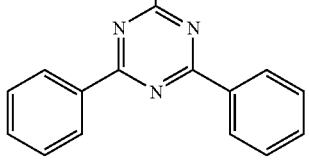 |
| 216 | 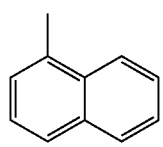 | H | 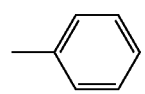 | 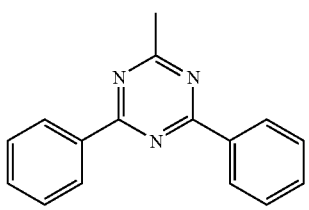 |
| 217 | 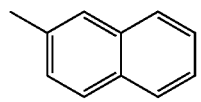 | H | 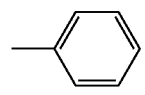 | 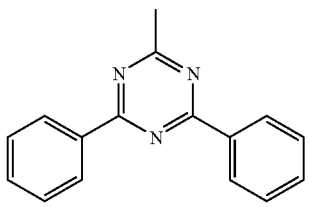 |
| 218 | 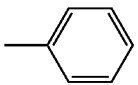 | H | 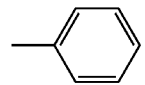 | 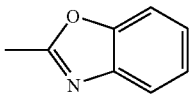 |
| 219 | 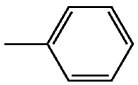 | H | 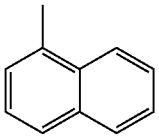 | 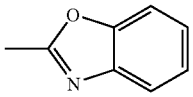 |
| 220 | 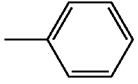 | H | 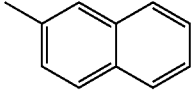 | 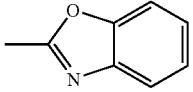 |
| 221 | 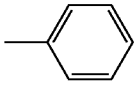 | 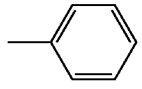 | 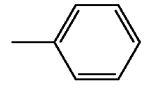 | 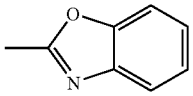 |
| 222 | 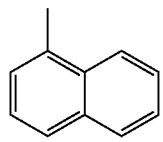 | H | 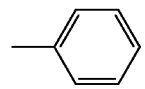 | 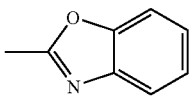 |
| 223 | 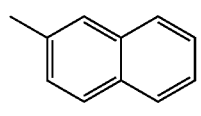 | H | 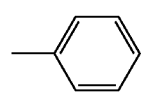 | 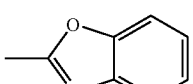 |

TABLE 12

| | Ar₄ | Ar₅ | Ar₆ | Ar₇ |
|---|---|---|---|---|
| 224 | phenyl | H | phenyl | benzothiazol-2-yl |
| 225 | phenyl | H | 1-naphthyl | benzothiazol-2-yl |
| 226 | phenyl | H | 2-naphthyl | benzothiazol-2-yl |
| 227 | phenyl | phenyl | phenyl | benzothiazol-2-yl |
| 228 | 1-naphthyl | H | phenyl | benzothiazol-2-yl |
| 229 | 2-naphthyl | H | phenyl | benzothiazol-2-yl |

In case where a compound is represented by formula II wherein $X_2$ is >SiAr$_8$Ar$_9$ and Ar$_8$ and/or Ar$_9$ are substituted or unsubstituted aromatic heterocyclic groups, preferred examples such a compound are shown in Tables 13 and 14.

TABLE 13

| | Ar₄ | Ar₅ | Ar₆ | Ar₈ | Ar₉ |
|---|---|---|---|---|---|
| 230 | phenyl | H | phenyl | phenyl | pyrrol-1-yl |
| 231 | phenyl | H | phenyl | pyrrol-1-yl | pyrrol-1-yl |
| 232 | phenyl | phenyl | phenyl | phenyl | pyrrol-1-yl |
| 233 | phenyl | phenyl | phenyl | pyrrol-1-yl | pyrrol-1-yl |

TABLE 13-continued
| | Ar₄ | Ar₅ | Ar₆ | Ar₈ | Ar₉ |
|---|---|---|---|---|---|
| 234 | 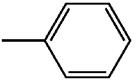 | H | 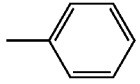 |  |  |
| 235 | 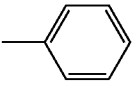 | H | 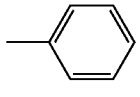 | 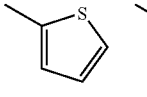 |  |
| 236 | 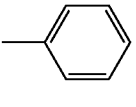 | 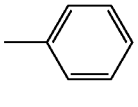 | 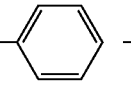 | 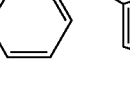 |  |
| 237 | 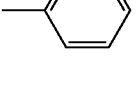 | 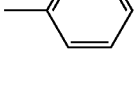 | 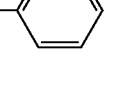 |  |  |
| 238 | 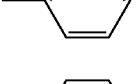 | H | 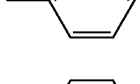 | 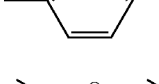 |  |
| 239 | 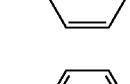 | H | 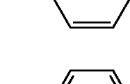 | 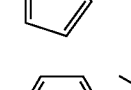 |  |
| 240 | 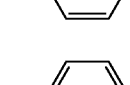 | 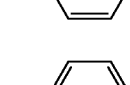 | 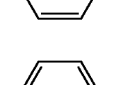 | 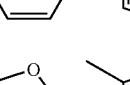 |  |
| 241 | 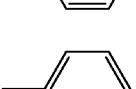 | 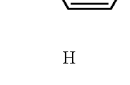 |  |  |  |
| 242 | 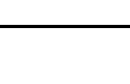 | H | 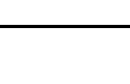 | 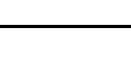 |  |
TABLE 14
| | Ar₄ | Ar₅ | Ar₆ | Ar₈ | Ar₉ |
|---|---|---|---|---|---|
| 243 | 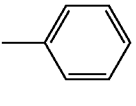 | H | 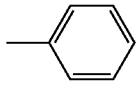 | 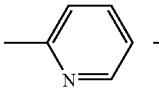 |  |
| 244 | 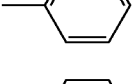 | 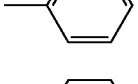 | 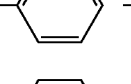 | 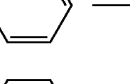 |  |
| 245 | 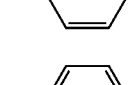 | 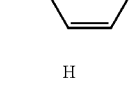 | 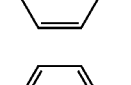 | 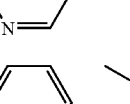 |  |
| 246 | 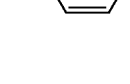 | H | 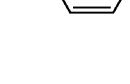 | 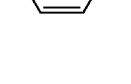 |  |

TABLE 14-continued

| | Ar₄ | Ar₅ | Ar₆ | Ar₈ | Ar₉ |
|---|---|---|---|---|---|
| 247 | phenyl | H | phenyl | thiazolyl | thiazolyl |
| 248 | phenyl | phenyl | phenyl | phenyl | thiazolyl |
| 249 | phenyl | phenyl | phenyl | thiazolyl | thiazolyl |
| 250 | phenyl | H | phenyl | phenyl | oxazolyl |
| 251 | phenyl | H | phenyl | oxazolyl | oxazolyl |
| 252 | phenyl | phenyl | phenyl | phenyl | oxazolyl |
| 253 | phenyl | phenyl | phenyl | oxazolyl | oxazolyl |

An organic EL device provided by this invention comprises a secondary component, that is, a phosphorescent dopant material, in its light-emitting layer. Any of the known phosphorescent metal complexes described in the aforementioned patent and non-patent references can be used as a dopant material and these phosphorescent organic metal complexes preferably contain a metal selected from groups 7 to 11 of the periodic table at the center. This metal is preferably selected from ruthenium, rhodium, palladium, silver, rhenium, osmium, iridium, platinum, and gold. Either one kind or two kinds or more of these dopant materials and metals may be used.

Phosphorescent dopant materials are publicly known as described in the patent reference 1 and elsewhere. Furthermore, phosphorescent dopant materials are preferably phosphorescent ortho-metalated metal complexes or porphyrin metal complexes. Such ortho-metalated metal complexes and porphyrin metal complexes are publicly known as described in the patent reference 6 and elsewhere. Therefore, it is possible to use freely these known phosphorescent dopant materials.

Organic metal complexes preferably have a noble metal such as Ir at the center and preferred examples are Ir(ppy)₃ (formula A), Ir(bt)2.acac3 (formula B), and PtOEt3 (formula C). These complexes are concretely shown below, but not limited to these examples.

[Chem 3]

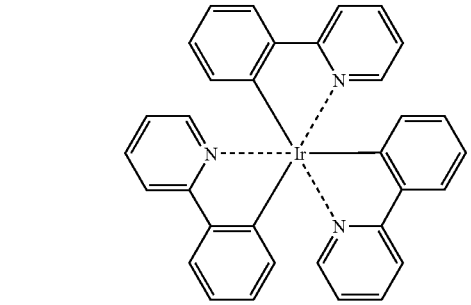

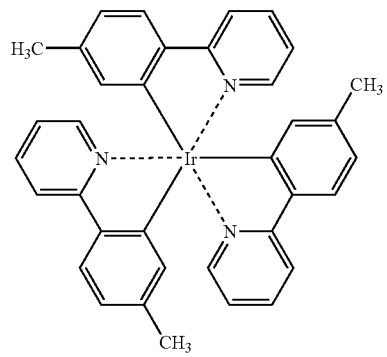

-continued
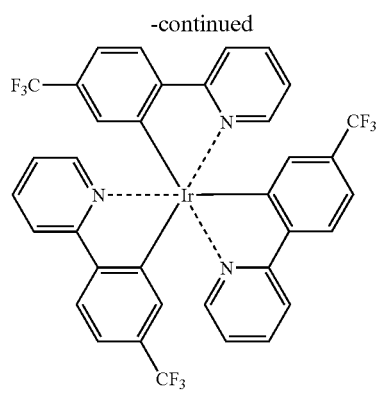
[Chem 4]
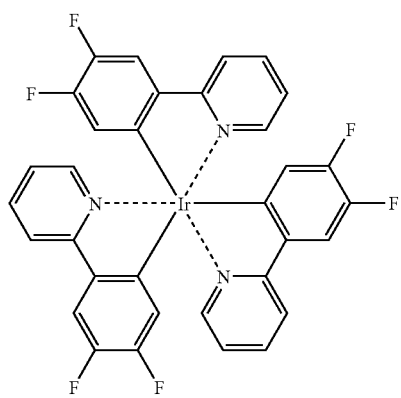
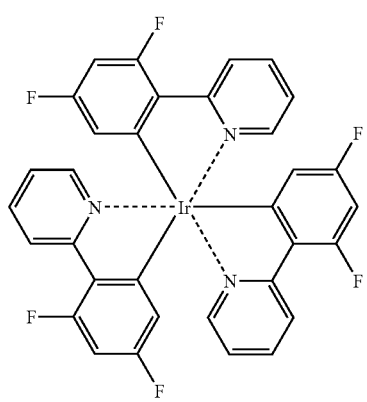
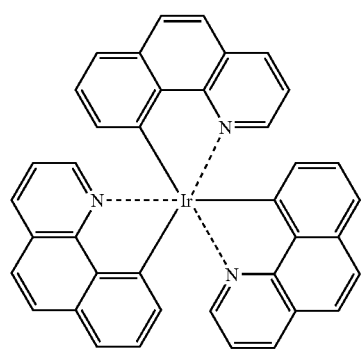
-continued
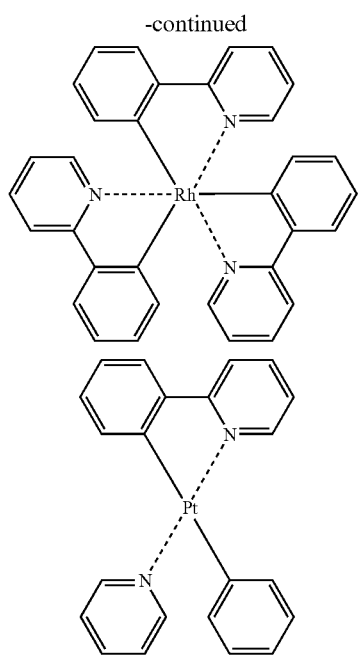
(A)
[Chem 5]
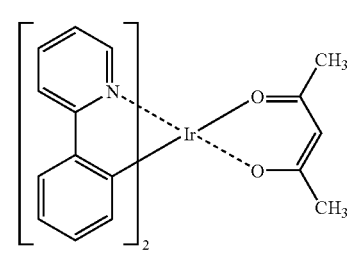
(B)
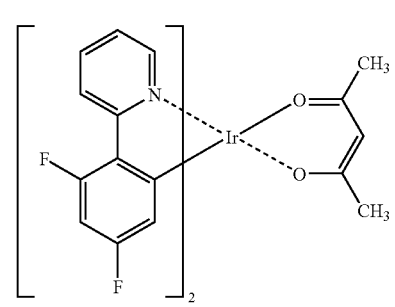
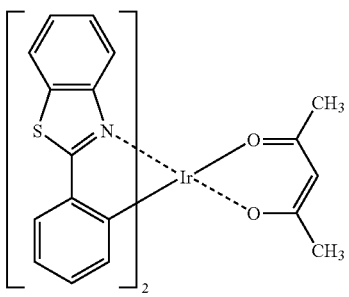

-continued
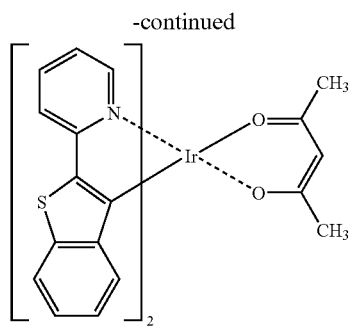
[Chem 6]
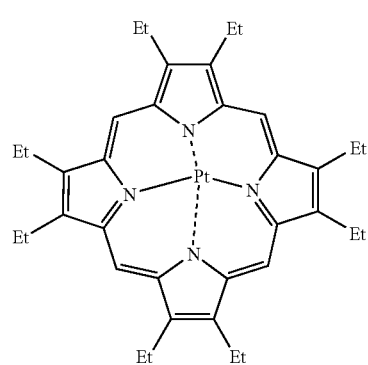
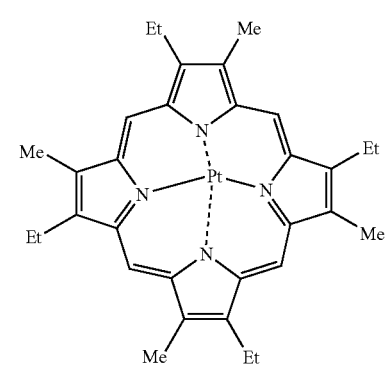
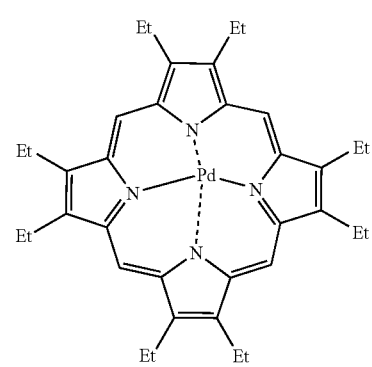
-continued
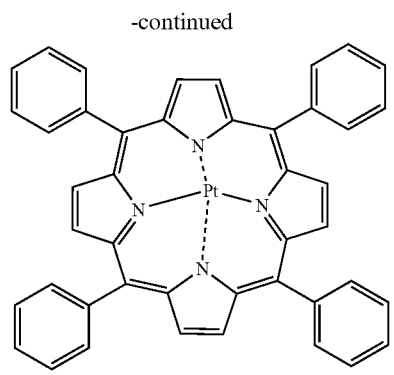
(C)
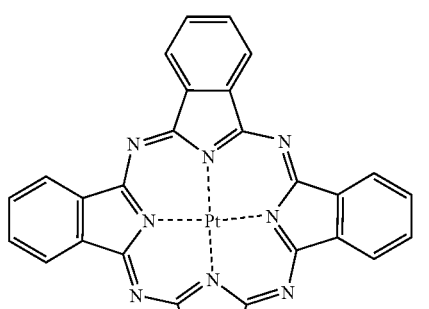
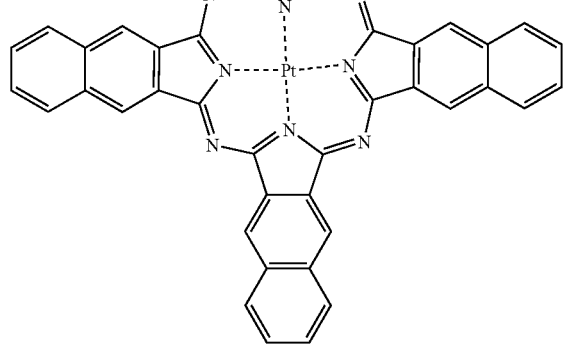

NUMBERING IN THE DRAWING

Figure 1:
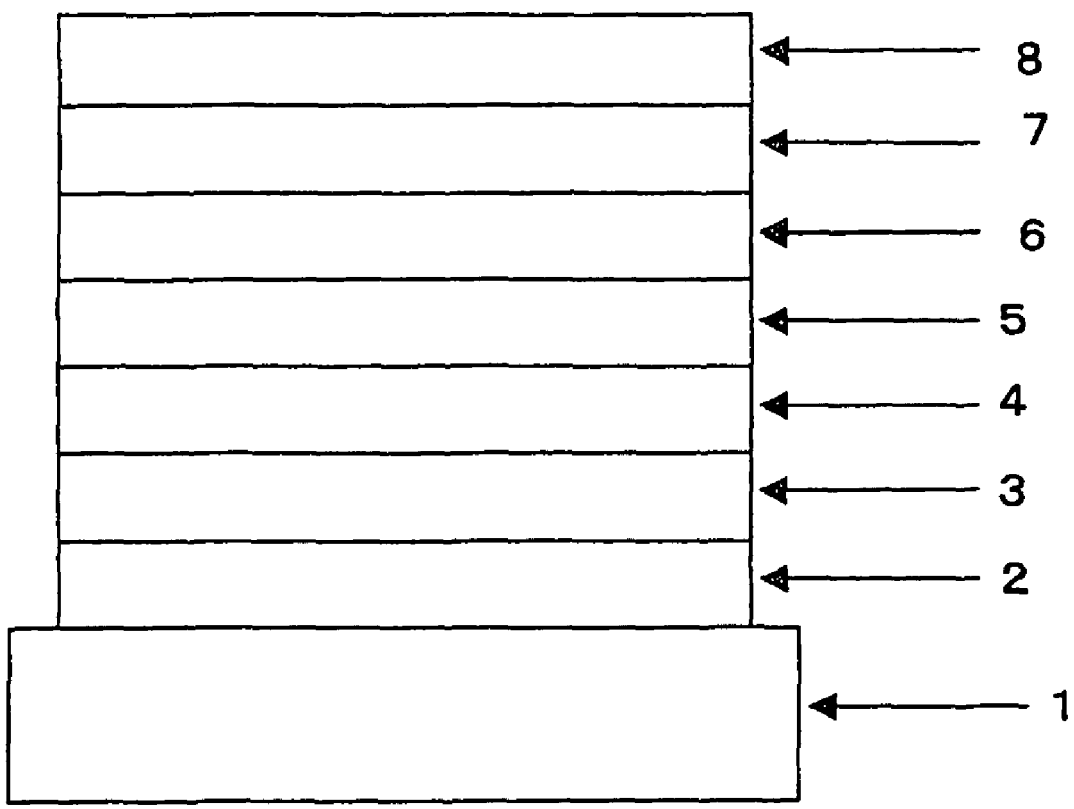
FIG. 1 is a schematic drawing illustrating the layered structure of an organic EL device.

1: Substrate
2: Anode
3: Hole-injecting layer
4: Hole-transporting layer
5: Light-emitting layer
6: Hole-blocking layer
7: Electron-transporting layer
8: Cathode

PREFERRED EMBODIMENTS OF THE INVENTION

An organic EL device of this invention will be described below with reference to the drawing. FIG. 1 schematically illustrates the cross section of a structure generally used for an organic EL device in this invention. In FIG. 1, a substrate is designated as 1, an anode as 2, a hole-injecting layer as 3, a hole-transporting layer as 4, a light-emitting layer as 5, a hole-blocking layer as 6, and a cathode as 8. Normally, the hole-injecting layer 3 through the electron-transporting layer 7 are organic layers and an organic EL device of this invention contains one layer or more, inclusive of the light-emitting layer 5, of the organic layers. The organic layers advantageously comprise three or more layers, preferably five or more layers, inclusive of the light-emitting layer 5. FIG. 1 shows one example of the layered structure and it is possible to add or omit one or more layers.

The substrate 1 serves as a support of an organic electroluminescent device and is made from a quartz or glass plate, a metal plate or foil, or a plastic film or sheet. In particular, transparent sheets of synthetic resins such as polyester, polymethacrylate, polycarbonate, and polysulfone are desirable. When a substrate made from a synthetic resin is used, it is necessary to take the gas barrier property of the resin into consideration. When the gas barrier property of the substrate is poor, the air may undesirably passes through the substrate to degrade the organic electroluminescent device. One of the remedial procedures is to provide a dense silicon oxide film on at least one side of the synthetic resin substrate to secure the necessary gas barrier property.

The anode 2 is provided on the substrate 1 and it plays a role of injecting holes into the hole-transporting layer. The anode is usually constructed of a metal such as aluminum, gold, silver, nickel, palladium, and platinum, a metal oxide such as oxide of indium and/or tin, a metal halide such as copper iodide, carbon black, or an electrically conductive polymer such as poly(3-methylthiophene), polypyrrole, and polyaniline. The anode is usually formed by a technique such as sputtering and vacuum deposition. When the anode is formed from fine particles of silver, copper iodide, carbon black, an electrically conductive metal oxide, or an electrically conductive polymer, the particles are dispersed in a solution of a suitable binder resin and applied to the substrate 1 to form the anode 2. Furthermore, in the case of an electrically conductive polymer, it is possible to form the anode 2 by forming a thin film of the polymer directly on the substrate 1 by electrolytic polymerization of the corresponding monomer or by coating the substrate 1 with the electrically conductive polymer. The anode 2 may also be formed by piling different materials one upon another. The anode varies in thickness with the requirement for transparency. Where transparency is required, it is preferable to keep the transmittance of visible light usually at 60% or more, preferably at 80% or more. In this case, the thickness is usually 5 to 1000 nm, preferably 10 to 500 nm. Where opaqueness is tolerated, the anode 2 may be the same as the substrate 1. Further, it is possible to laminate a different electrically conductive material on the aforementioned anode 2.

A practice adopted for the purposes of enhancing the efficiency of hole injection and improving the adhesive strength of the organic layers as a whole to the anode is interposing the hole-injecting layer 3 between the hole-transporting layer 4 and the anode 2. The interposition of the hole-injecting layer 3 is effective for lowering the initial driving voltage of a device and at the same time suppressing a rise in voltage when a device is driven continuously at a constant current density.

The material selected for the hole-injecting layer must satisfy the following requirements: it produces a close contact with the anode; it is capable of forming a uniform thin film; it is thermally stable, that is, it has a melting point of 300° C. or above or a glass transition temperature of 100° C. or above; it has low ionization potential to facilitate the injection of holes from the anode; and it shows high hole mobility.

Phthalocyanine compounds such as copper phthalocyanine, organic compounds such as polyaniline and polythiophene, sputtered carbon membranes, and metal oxides such as vanadium oxide, ruthenium oxide, and molybdenum oxide have been reported as materials capable of attaining this object. In the case of an anode buffer layer, it is possible to form a thin film in the same manner as for the hole-transporting layer. In the case of inorganic materials, it is further possible to apply such methods as sputtering, electron beam evaporation, and plasma CVD. The thickness of the hole-injecting layer 3 thus formed is usually 3 to 100 nm, preferably 5 to 50 nm.

The hole-transporting layer 4 is provided on the hole-injecting layer 3. The material selected for the hole-transporting layer must be capable of injecting holes from the hole-injecting layer 3 efficiently and transporting the injected holes efficiently. To attain this object, the material must satisfy the following requirements: it has low ionization potential; it is highly transparent against visible light; it shows high hole mobility; it is highly stable and disinclined to generate impurities that become traps during its preparation or use. The material must not quench the light from the light-emitting layer 5 as it is in contact therewith nor form exciplexes at the interface with the light-emitting layer to lower the efficiency. Besides the aforementioned general requirements, good heat resistance is additionally required where application to vehicular displays is considered. Hence, the material preferably has a Tg of 90° C. or above.

The compounds useful for such hole-transporting materials include aromatic diamines containing two tertiary amines whose nitrogen atoms are substituted with two or more aromatic condensed rings typically represented by 4,4'-bis[N-(1-naphthyl)-N-phenylamino]biphenyl, aromatic amines of a starburst structure such as 4,4',4"-tris(1-naphthylphenylamino)triphenylamine, an aromatic amine consisting of a tetramer of triphenylamine, and spiro compounds such as 2,2',7,7'-tetrakis-(diphenylamino)-9,9'-spirobifluorene. These compounds may be used singly or as a mixture.

Besides the aforementioned compounds, the materials useful for the hole-transporting layer 4 include polymeric materials such as polyvinylcarbazole, polyvinyltriphenylamine, and polyaryleneethersulfones containing tetraphenylbenzidine. When the coating process is used in forming the hole-transporting layer, a coating solution is prepared by dissolving one kind or more of hole-transporting materials and, if necessary, together with binder resins that do not become traps of holes and additives such as improvers of coating properties, the solution is applied to the anode 2 or the hole-injecting layer 3 by a process such as spin coating, and the solution is dried to form the hole-transporting layer 4. The binder resins here include polycarbonate, polyarylate, and polyester. Addition of a binder resin in a large amount lowers the hole mobility and it is preferably kept at a low level, usually below 50 wt %.

When the vacuum deposition process is used in forming the hole-transporting layer, the selected hole-transporting material is introduced to a crucible placed in a vacuum container, the container is evacuated to $1\times10^{-4}$ Pa or so by a suitable vacuum pump, the crucible is heated to evaporate the hole-transporting material and the hole-transporting layer 4 is formed on the substrate 1 which is placed opposite the crucible and on which the anode has been formed. The thickness of the hole-transporting layer 4 is usually 5 to 300 nm, preferably 10 to 100 nm. The vacuum deposition process is generally used in forming a thin film uniformly.

The light-emitting layer 5 is provided on the hole-transporting layer 4. The light-emitting layer 5 comprises the aforementioned host material and phosphorescent dopant material and, on application of an electrical field between the electrodes, the holes that are injected from the anode and migrating through the hole-transporting layer recombine with the electrons that are injected from the cathode and migrating through the electron-transporting layer 7 (or the hole-blocking layer 6) to undergo excitation thereby causing intense luminescence. The light-emitting layer 5 may contain other components, for example, other host materials which are non-essential components in this invention and fluorescent colorants to the extent that they do not damage the performance of this invention.

The host material selected for use in the light-emitting layer must inject holes at high efficiency from the hole-transporting layer 4 and also inject electrons at high efficiency from the electron-transporting layer 7 (or the hole-blocking layer 6). To achieve this end, the host material must satisfy the following requirements: its ionization potential has an adequate value; it shows high mobility of holes and electrons; it is electrochemically stable and disinclined to generate impurities that become traps during its preparation or use; and still further, it must not form exciplexes at the interface with the neighboring hole-transporting layer 4 or the electron-transporting layer 7 (or the hole-blocking layer 6) to lower the efficiency. Besides the aforementioned general requirements, good heat resistance is additionally required where application of the device to vehicular displays is considered. Therefore, the material preferably has a Tg of 90° C. or above.

In the case where any of the organic metal complexes represented by the aforementioned formulas A, B, and C is used as a dopant material, the content of the material in the light-emitting layer is preferably in the range of 0.1 to 30 wt %. A content of less than 0.1 wt % does not contribute to improvement of the luminous efficiency of a device while a content in excess of 30 wt % causes concentration quenching due to dimerization of molecules of the organic metal complex and the like and, as a result, the luminous efficiency drops. In the conventional devices utilizing fluorescence (singlet), it is a desirable tendency for an organic metal complex to be in an amount somewhat larger than that of a fluorescent colorant (dopant) contained in the light-emitting layer. The organic metal complex may be contained partially or distributed nonuniformly in the direction of film thickness in the light-emitting layer. The thickness of the light-emitting layer 5 is usually 10 to 200 nm, preferably 20 to 100 nm.

The light-emitting layer 5 is advantageously formed by the vacuum deposition process. A host material and a dopant material are introduced together to a crucible placed in a vacuum container, the container is evacuated to $1\times10^{-4}$ Pa or so by a suitable vacuum pump, the crucible is heated to evaporate both the host material and the dopant material and they are deposited on the hole-transporting layer 4. The rates of deposition of the host material and the dopant material are monitored separately to control the content of the dopant material in the host material.

The hole-blocking layer 6 is formed on the light-emitting layer 5 so that the blocking layer contacts the light-emitting layer 5 on the cathode side and it is formed from a compound which is capable of inhibiting the holes that are migrating through the hole-transporting layer from reaching the cathode and of transporting the electrons that are injected from the cathode toward the light-emitting layer efficiently. The properties required for a material constituting the hole-blocking layer are high electron mobility and low hole mobility. The hole-blocking layer 6 has a function of confining holes and electrons in the light-emitting layer thereby improving the luminous efficiency.

The electron-transporting layer 7 is formed from a compound which is capable of transporting the electrons that are injected from the cathode toward the hole-blocking layer 6 upon application of an electrical field between the electrodes. An electron-transporting compound useful for the electron-transporting layer 7 is required to inject electrons from the cathode 8 at high efficiency and show high electron mobility to allow efficient transport of the injected electrons.

The materials satisfying these requirements include metal complexes such as 8-hydroxyquinoline aluminum complex, 10-hydroxybenzo[h]quinoline metal complexes, oxadizole derivatives, distyrylbiphenyl derivatives, silole derivatives, 3- or 5-hydroxyflavone metal complexes, benzoxazole metal complexes, benzothiazole metal complexes, trisbenzimidazolylbenzene, quinoxaline compounds, phenanthroline derivatives, 2-t-butyl-9,10-N,N'-dicyanoanthraquinonediimine, n-type hydrogenated amorphous silicon carbide, n-type zinc sulfide, and n-type zinc selenide. The thickness of the electron-transporting layer 7 is usually 5 to 200 nm, preferably 10 to 100 nm.

The electron-transporting layer 7 is formed on the hole-blocking layer 6 by coating or vacuum deposition as in the formation of the hole-transporting layer 4. The vacuum deposition process is normally used.

The cathode 8 plays a role of injecting electrons into the light-emitting layer 5. The aforementioned material for the anode 2 may be used for the cathode 8, but a metal of low work function such as tin, magnesium, indium, calcium, aluminum, and silver and alloys thereof is preferably used for efficient injection of electrons. Concrete examples are alloy electrodes formed from alloys of low work function such as magnesium-silver alloys, magnesium-indium alloys, and aluminum-lithium alloys. Furthermore, inserting an ultrathin insulating film (0.1 to 5 nm) of LiF, $MgF_2$, $Li_2O$, and the like to the interface of the cathode and the electron-transporting layer is an effective method for improving the efficiency of a device. The thickness of the cathode 8 is usually the same as that for the anode 2. To protect a cathode made from a metal of low work function, the cathode is further covered with a layer of a metal of high work function and good stability in the air thereby improving the stability of a device. Metals such as aluminum, silver, copper, nickel, chromium, gold, and platinum are used for this purpose.

It is possible to construct a device having a structure which is the reverse of the structure shown in FIG. 1; for example, one device is formed by piling the cathode 8, the hole-blocking layer 6, the light-emitting layer 5, the hole-transporting layer 4, and the anode 2 one upon another in this order on the substrate 1 and another device is formed in such a manner as to have a structure of substrate 1/cathode 8/electron-transporting layer 7/hole-blocking layer 6/light-emitting layer 5/hole-transporting layer 4/hole-injecting layer 3/anode 2. As described earlier, it is also possible to provide an organic electroluminescent device of this invention between two substrates at least one of which is highly transparent.

EXAMPLES

Synthetic Example 1

In a 2000-ml four-necked flask were placed 13.0 g (0.23 mole) of potassium hydroxide and 1004.5 g of ethanol. The mixture was stirred at room temperature until the potassium hydroxide dissolved and 25.8 g (0.12 mole) of chalcone and 26.4 g (0.24 mole) of phenylhydrazine were added at room temperature. After the addition, the mixture was heated under reflux with stirring for three hours. Upon completion of the reaction, the reaction mixture was cooled to room temperature and a solid was recovered by filtration. The solid was washed with hexane and dried under reduced pressure to give 27.8 g of 1,3,5-triphenylpyrazoline as a white powder.

Then, 156.0 g of acetonitrile was placed in a 500-ml four-necked flask. Thereafter, 60.0 g (0.181 mole) of antimony pentachloride was added in drops over a period of 20 minutes to prevent vigorous generation of heat. After the addition, the mixture was allowed to cool to room temperature and a slurry of 25.0 g (0.084 mole) of the 1,3,5-triphenylpyrazoline obtained above in 130.2 g of acetonitrile was added in drops. After the addition, the stirring was continued at room temperature for 30 minutes. Upon completion of the reaction, a solid was recovered by filtration, washed with acetonitrile, and dried under reduced pressure to give 40.6 g of a dark green powder. In a 500-ml four-necked flask were placed 35.0 g of the dark green powder and 681.3 g (8.18 moles) of pyridine and the mixture was stirred at room temperature for one hour. Upon completion of the reaction, a solid was recovered by filtration. The crystalline solid was recrystallized from methylene chloride and benzene to give 4.2 g of white crystalline 4,4-bis(3,5-diphenylpyrazol-1-yl)biphenyl (hereinafter referred to as BPP). The product showed a purity of 100% (area ratio, HPLC), a mass of 590, and a melting point of 285.4° C. and corresponds to the compound listed as No. 101 in Table 1.

The sequence of reactions in Synthetic Example 1 is shown below.

[Chem 7]

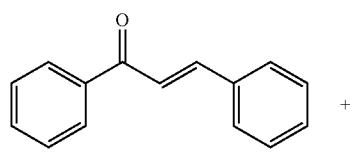

+

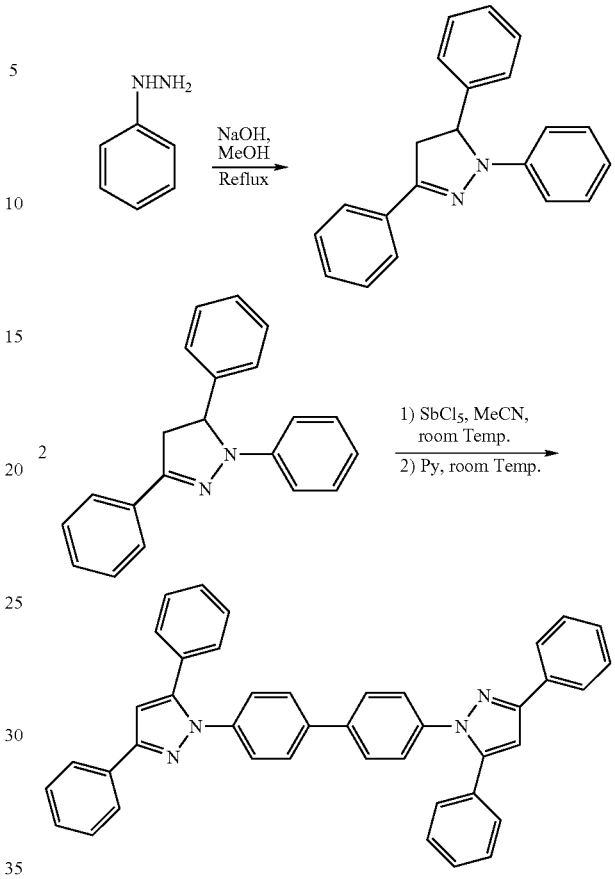

The results of the infrared analysis (KBr tablet technique) of BPP are shown below.

$cm^{-1}$: 3454, 3046, 1608, 1551, 1503, 1461, 1434, 1413, 1398, 1365, 1182, 1083, 1026, 1008, 972, 957, 915, 855, 828, 762, 693, 603, 546, 501

Synthetic Example 2

In a 500-ml four-necked flask were placed 21.9 g (0.55 mole) of sodium hydroxide, 100.1 g of methanol, and 195.8 g of deionized water. The mixture was stirred at room temperature until the sodium hydroxide dissolved and 73.8 g (0.43 mole) of 1-acetonaphthone was added. Thereafter, the mixture was cooled by ice water and 48.8 g (0.46 mole) of benzaldehyde was added. After the addition, the mixture was heated under reflux with stirring for three hours. Upon completion of the reaction, the reaction mixture was cooled to room temperature and transferred to a separatory funnel to separate an organic layer. The organic layer was distilled under reduced pressure to remove the solvent and 106.9 g of 1-naphthalen-1-yl-3-phenyl-propenone was obtained as a yellow liquid.

Starting with the 1-naphthalen-1-yl-3-phenyl-propenone, a reaction similar to the one in Synthetic Example 1 was carried out to give 4,4-bis[3-(1-naphthyl)-5-phenylpyrazol-1-yl]biphenyl (hereinafter referred to as a-BNP). The product showed a purity of 99.65% (area ratio, HPLC), a mass of 690, and a melting point of 263.5° C. and corresponds to the compound listed as No. 113 in Table 1.

The sequence of reactions in Synthetic Example 2 is shown below.

[Chem 8]

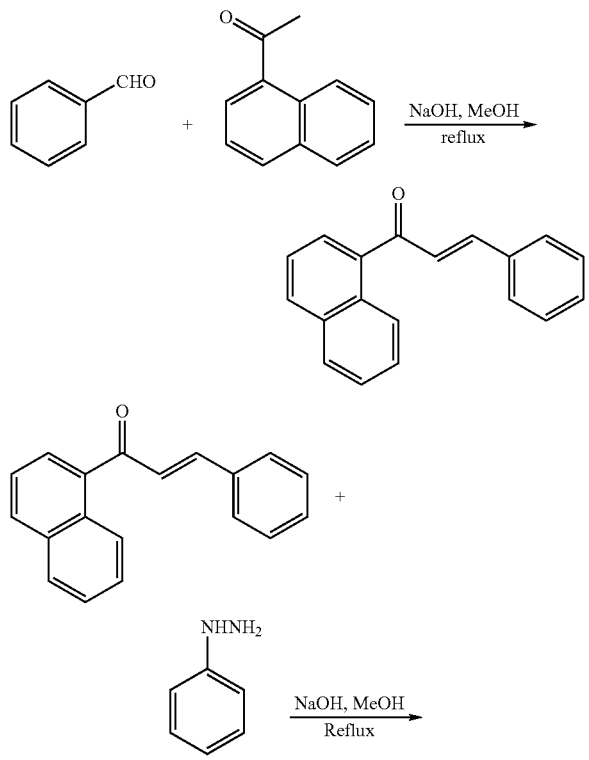

[Chem 9]

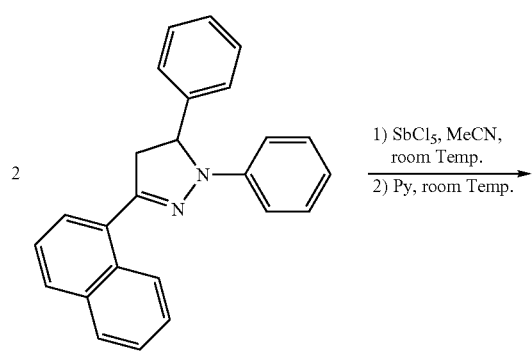

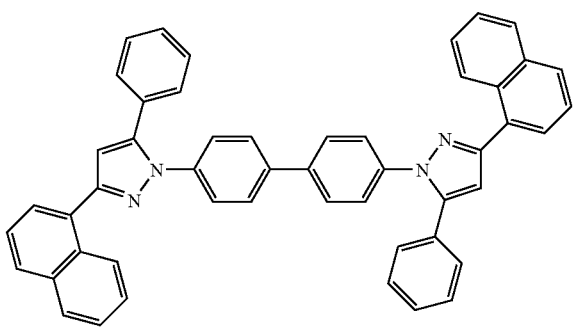

The results of the infrared analysis (KBr tablet technique) of α-BNP are shown below.

$cm^{-1}$: 3448, 3044, 1606, 1546, 1500, 1470, 1452, 1414, 1380, 1360, 1324, 1006, 972, 936, 844, 828, 800, 774, 762, 694, 602, 428

Synthetic Example 3

The reaction was carried out as in Synthetic Example 2 with the exception of using 30.0 g (0.75 mole) of sodium hydroxide, 104.7 g of methanol, 279.0 g of deionized water, 85.1 g (0.50 mole) of 2-acenaphthone in place of 1-acenaphthone, and 53.1 g (0.50 mole) of benzaldehyde to give 4,4-bis[3-(2-naphthyl)-5-phenylpyrazol-1-yl]biphenyl (hereinafter referred to as β-BNP). The product showed a purity of 99.52% (area ratio, HPLC), a mass of 690, and a melting point of 287.1° C. and corresponds to the compound listed as No. 107.

The sequence of reactions in Synthetic Example 3 is shown below.

[Chem 10]

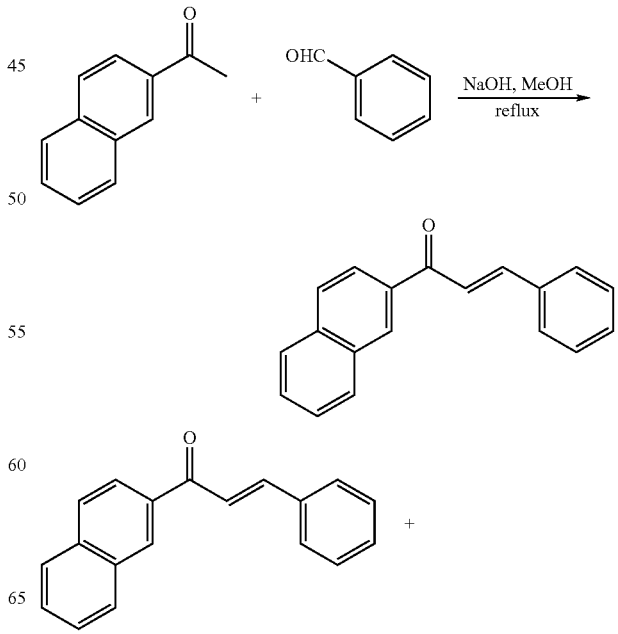

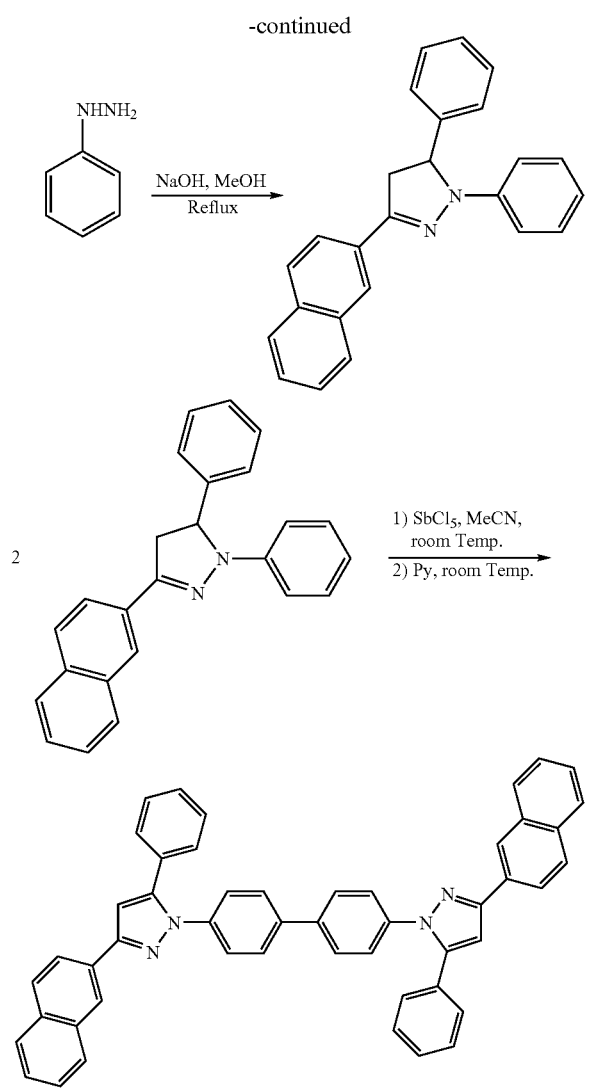

The results of the infrared analysis (KBr tablet technique) of β-BNP are shown below.

cm$^1$: 3448, 3052, 1630, 1608, 1504, 1476, 1452, 1412, 1374, 1326, 970, 860, 826, 802, 762, 696, 474, 404

Synthetic Example 4

In a 500-ml four-necked flask were placed 25.2 g (0.11 mole) of 1,3-diphenylpropanedione, 25.3 g (0.11 mole) of p-bromophenylhydrazine hydrochloride, and 234.7 g of toluene. The mixture was stirred at room temperature and 6.0 g (0.11 mole) of sodium methoxide was added in drops at room temperature. After the addition, the mixture was heated under reflux with stirring for three hours. Upon completion of the reaction, the reaction mixture was cooled to room temperature and a solid was recovered by filtration. The filtrate was concentrated under reduced pressure to dryness. To the residue was added 350 ml of methanol and the mixture was heated with stirring for one hour. Thereafter, the mixture was cooled to room temperature and a solid was recovered by filtration. The solid was washed with methanol and dried under reduced pressure to give 28.4 g of 1-(p-bromophenyl)-3,5-diphenylpyrazole.

After this, 1.87 g (0.005 mole) of the 1-(p-bromophenyl)-3,5-diphenylpyrazole obtained above and 10.0 ml of THF were placed in a 200-ml four-necked flask. The mixture was stirred at room temperature and 6.0 ml (0.010 mole) of a 1.7 M hexane solution of tert-butyllithium was added in drops at room temperature. After the addition, the stirring was continued at room temperature for one hour. A solution of 0.70 g (0.003 mole) of diphenyldichlorosilane in 10.0 ml of THF was further added from a dropping funnel at room temperature. After the addition, the mixture was heated under reflux with stirring for eight hours. Upon completion of the reaction, the reaction mixture was cooled to room temperature and water and toluene were added. The reaction mixture was transferred to a separatory funnel and an organic layer was separated. The organic layer was distilled under reduced pressure to remove the solvent and the remainder was submitted to column purification to give 0.40 g of bis[4-(3,5-diphenylpyrazol-1-yl)phenyl]diphenylsilane (hereinafter referred to as BPPS) as a light yellow powder. The product showed a purity of 100% (area ratio, HPLC), a mass of 773, and a melting point of 235.7° C. and corresponds to the compound listed as No. 153.

The sequence of reactions in Synthetic Example 4 is shown below.

[Chem 12]

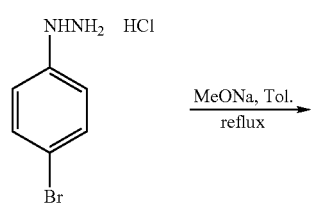

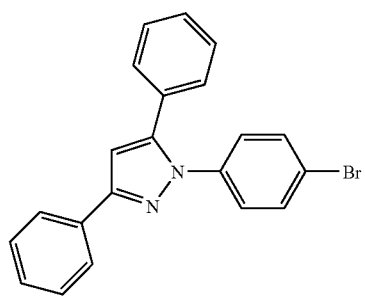

-continued

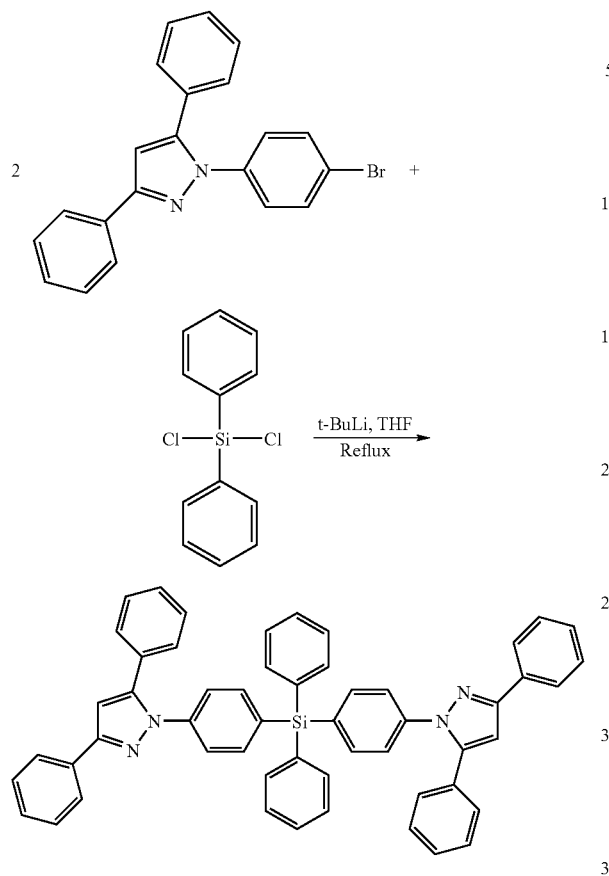

The results of the infrared analysis (KBr tablet technique) of BPPS are shown below.

cm$^{-1}$: 3448, 3052, 1588, 1480, 1460, 1438, 1428, 1408, 1358, 1122, 1104, 1074, 970, 956, 760, 742, 694, 656, 602, 540, 532, 510

Synthetic Example 5

In a 50-ml four-necked flask were placed 5.00 g (0.013 mole) of 1-(p-bromophenyl)-3,5-diphenylpyrazole which was the reaction intermediate in Synthetic Example 4, 1.77 g (0.018 mole) of sodium tert-butoxide, 0.60 g (0.006 mole) of aniline, and 25.0 ml of xylene under a nitrogen atmosphere. The mixture was stirred at room temperature and 4.2 mg (0.019 millimole) of palladium acetate and 0.08 ml of tri-tert-butylphosphine were added in drops at room temperature. After the addition, the mixture was stirred in an oil bath of 180° C. for 45 hours. After the reaction was over, the mixture was cooled to room temperature and xylene and water were added in drops. The reaction mixture was transferred to a separatory funnel and an organic layer was separated. The organic layer was distilled under reduced pressure to remove the solvent and the remainder was submitted to column purification to give 3.80 g of N,N-bis[4-(3,5-diphenylpyrazol-1-yl)phenyl]phenylamine (hereinafter referred to as BDPPA) as a light brown powder. The product showed a purity of 99.79% (area ratio, HPLC), a mass of 681, and a melting point of 119.1° C. and corresponds to the compound listed as No. 119.

The sequence of reaction in Synthetic Example 5 is shown below.

[Chem 13]

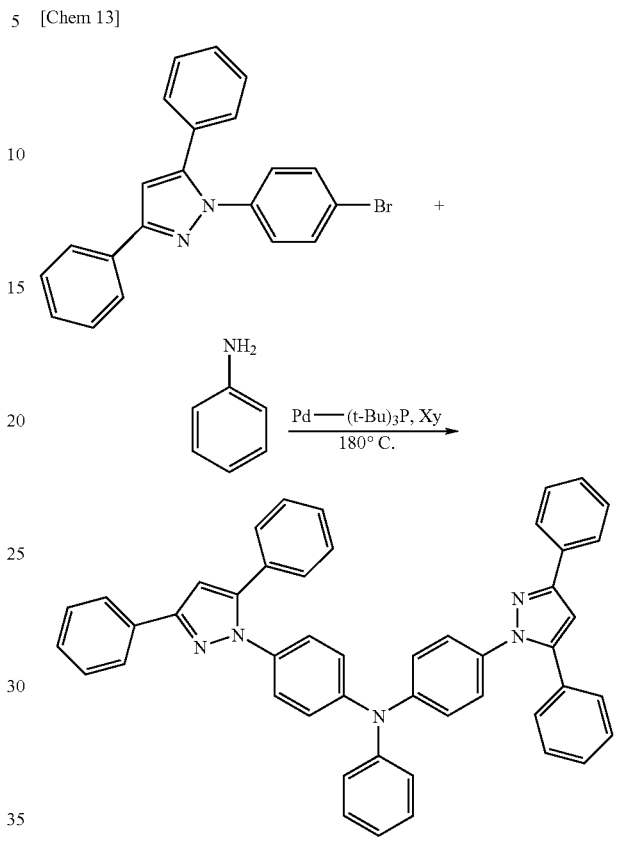

The results of the IR analysis (KBr tablet technique) of BDPPA are shown below.

cm$^{-1}$: 3432, 3052, 1604, 1510, 1488, 1460, 1332, 1274, 972, 838, 824, 758, 694, 596, 548, 520

Synthetic Example 6

In a 500-ml four-necked flask were placed 22.4 g (0.10 mole) of 1,3-diphenylpropanedione, 20.0 g (0.13 mole) of p-nitrophenylhydrazine, and 200.7 g of toluene. The mixture was then heated under reflux with stirring for three hours. Upon completion of the reaction, the reaction mixture was cooled to room temperature and a solid was recovered by filtration. The filtrate was concentrated under reduced pressure to dryness. The residue was purified by reslurrying by adding 300 ml of methanol. Thereafter, the residue was cooled to room temperature and a solid was recovered by filtration. The solid was washed with methanol and dried under reduced pressure to give 26.0 g of 1-(p-nitrophenyl)-3,5-diphenylpyrazole.

Then, 10.0 g (0.029 mole) of the 1-(p-nitrophenyl)-3,5-diphenylpyrazole obtained above, 10.0 g (0.179 mole) of iron powder, 78.9 g of ethanol, and 0.5 g (0.005 mole) of concentrated hydrochloric acid were placed in a 200-ml four-necked flask. The mixture was then heated under reflux with stirring for 23 hours. Upon completion of the reaction, the reaction mixture was cooled to room temperature and 400 ml of toluene was added in drops. Thereafter, a solid was separated by filtration. The filtrate was concentrated under reduced pressure until crystals separated out. The mixture was then cooled in an ice bath and a solid was recovered by filtration. The solid was washed with methanol and dried under reduced pressure to give 7.3 g of 1-(p-aminophenyl)-3,5-diphenylpyrazole.

Then, the procedure of Synthetic Example 5 was followed with the exception of using 3.8 g (0.010 mole) of 1-(p-bromophenyl)-3,5-diphenylpyrazole, 1.5 g (0.016 mole) of sodium tert-butoxide, 1.5 g (0.005 mole) of the 1-(p-aminophenyl)-3,5-diphenylpyrazole obtained above in place of aniline, 8.8 mg (0.04 millimole) of palladium acetate, 30 ml of xylene, and 0.10 ml of tri-tert-butylphosphine to give 2.4 g of tris[4-(3,5-diphenylpyrazol-1-yl)phenyl]amine (hereinafter referred to as TDPPA) as a white powder. The product showed a purity of 99.05% (area ratio, HPLC), a mass of 899, and a melting point of 265.6° C. and corresponds to the compound listed as No. 149.

The sequence of reactions in Synthetic Example 6 is shown below.

[Chem 14]

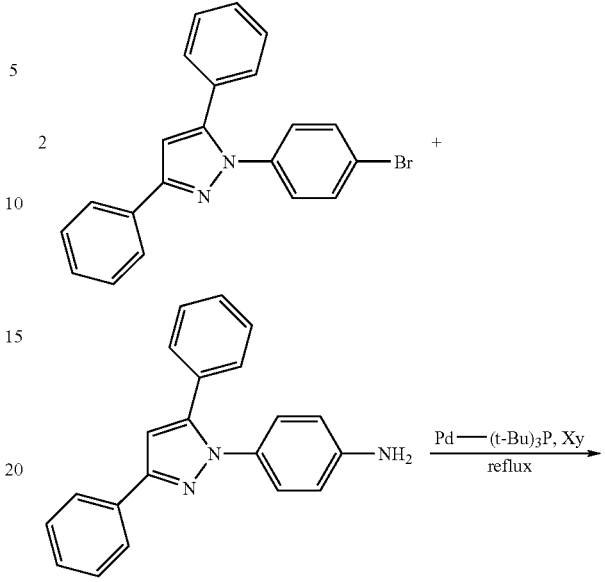

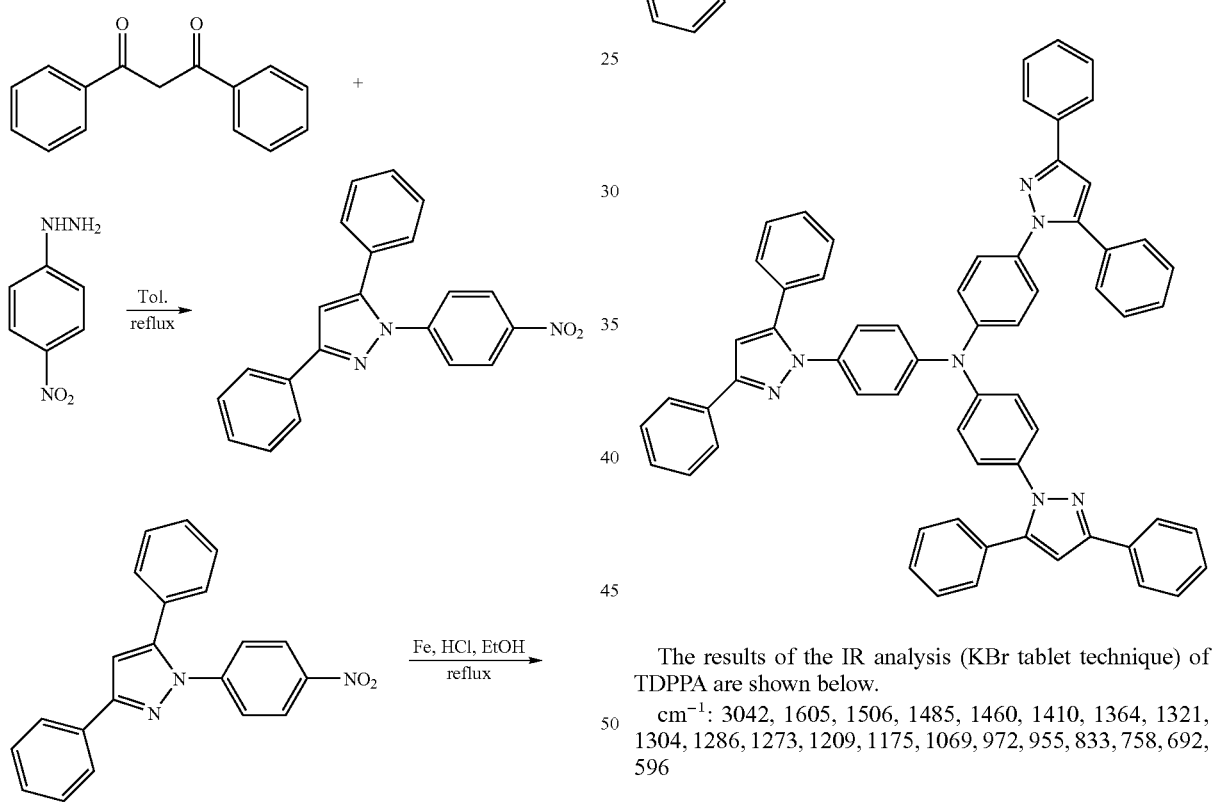

The results of the IR analysis (KBr tablet technique) of TDPPA are shown below.

$cm^{-1}$: 3042, 1605, 1506, 1485, 1460, 1410, 1364, 1321, 1304, 1286, 1273, 1209, 1175, 1069, 972, 955, 833, 758, 692, 596

Synthetic Example 7

In a 300-ml four-necked flask were placed 206.2 g (2.10 moles) of concentrated sulfuric acid and 19.6 g (0.19 mole) of 60% nitric acid. The mixture was stirred on an ice bath and 25.7 g (0.17 mole) of 4-phenylpyridine was added at 0° C. After the addition, the stirring was continued at 0° C. for three hours. The reaction mixture thus prepared was added in drops to 1250.0 g of ice placed in a 2000-ml four-necked flask. The mixture was stirred on an ice bath and 600.6 g (4.43 moles) of a 29.5% aqueous solution of sodium hydroxide was added in drops. Thereafter, a solid was recovered by filtration at 0° C. The solid was washed with water and recrystallized twice from 200 ml of 5M hydrochloric acid. To the solid thus obtained was added 200 ml of 5M hydrochloric acid in drops. The solid was dissolved by heating and 201.4 g (1.49 moles) of a 29.5% aqueous solution of sodium hydroxide was added in drops. The mixture was cooled to room temperature and a separated solid was recovered by filtration. The solid was washed with water and dried under reduced pressure to give 12.9 g of 4-(4-nitrophenyl)pyridine.

In a 1000-ml four-necked flask were placed 5.0 g (0.025 mole) of the 4-(4-nitrophenyl)pyridine obtained above, 27.8 g (0.498 mole) of iron powder, 361.0 g of ethanol, 2.3 ml (0.012 mole) of 5M hydrochloric acid, and 23.0 g of water. The mixture was then heated under reflux with stirring for two hours. Upon completion of the reaction, 400 ml of ethanol was added in drops and the reaction mixture was heated with stirring for additional 30 minutes. The reaction mixture was cooled to room temperature and a solid was separated by filtration. The filtrate was passed through a silica gel column and the filtrate obtained was concentrated under reduced pressure with dropwise addition of 200 ml of water until no more ethanol distilled out. Thereafter, a solid was recovered by filtration at room temperature. The solid was washed with water and dried under reduced pressure to give 2.9 g of 4-(4-aminophenyl)pyridine.

The procedure of Synthetic Example 5 was followed with the exception of using 7.0 g (0.019 mole) of 1-(p-bromophenyl)-3,5-diphenylpyrazole which was the intermediate in Synthetic Example 4, 3.4 g (0.035 mole) of sodium tert-butoxide, 1.5 g (0.009 mole) of the 4-(4-aminophenyl)pyridine obtained above in place of aniline, 17.6 mg (0.08 millimole) of palladium acetate, 20 ml of xylene, and 0.60 ml of tri-tert-butylphosphine to give 4.5 g of bis[4-(3,5-diphenylpyrazol-1-yl)phenyl][4-(4-pyridyl)phenyl]amine (hereinafter referred to as BDPPPA) as a white powder. The product showed a purity of 99.72% (area ratio, HPLC), a mass of 758, and a melting point of 241.6° C. and corresponds to the compound listed as No. 147.

The sequence of reactions in Synthetic Example 7 is shown below.

[Chem 15]

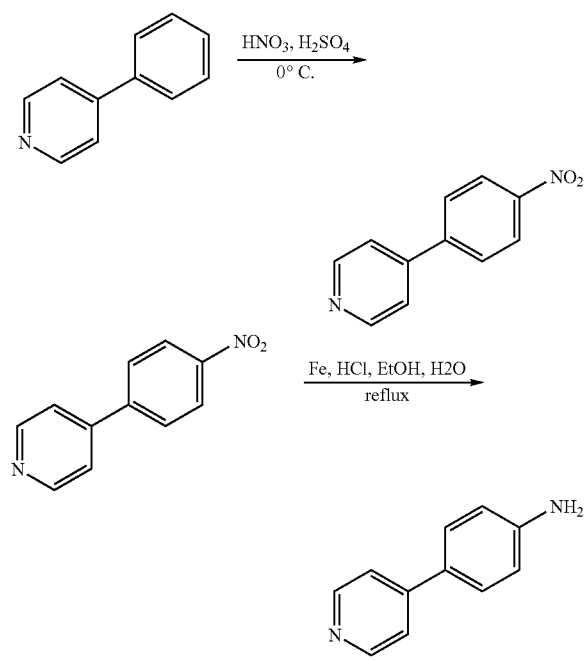

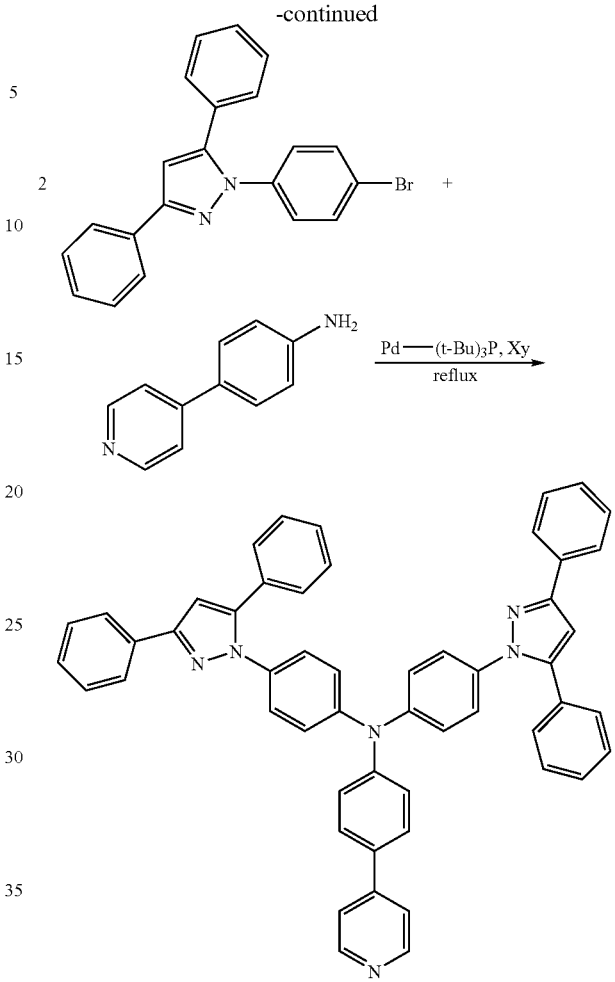

The results of the infrared analysis (KBr tablet technique) of BDPPPA are shown below.

$cm^{-1}$: 3119, 3049, 3030, 1591, 1508, 1485, 1460, 1366, 1325, 1294, 1281, 1180, 972, 841, 816, 806, 768, 727, 698, 544

Synthetic Example 8

In a 500-ml four-necked flask were placed 16.0 g (0.40 mole) of 60% sodium hydride (an oil-added grade), 39.6 g (0.20 mole) of deoxybenzoin, 200.0 g of toluene, and 198.8 g (1.46 moles) of methyl benzoate. The mixture was then heated under reflux with stirring for 15 hours while distilling off methanol. After the reaction was over, the reaction mixture was cooled to 40° C. and 60.8 g (0.60 mole) of concentrated hydrochloric acid and 180.0 g of water were added in drops. The reaction mixture was transferred to a separatory funnel and an organic layer was separated. The organic layer was concentrated under reduced pressure to dryness. The residue was purified by reslurrying with methanol and a solid was recovered by filtration and dried under reduced pressure to give 36.2 g of 1,2,3-triphenylpropane-1,3-dione.

After this, 10.3 g (0.046 mole) of p-bromophenylhydrazine hydrochloride, 2.36 g (0.043 mole) of sodium methoxide, and 79.3 g of toluene were placed in a 300-ml four-necked flask. The mixture was then heated under reflux with stirring for three hours while distilling off methanol. To this reaction mixture was added 12.4 g (0.041 mole) of the 1,2,3-triphenyl-propane-1,3-dione obtained above. After the addition, the mixture was heated under reflux with stirring for 20 hours. Upon completion of the reaction, the reaction mixture was cooled to room temperature and 39.7 g of water was added in drops. The reaction mixture was transferred to a separatory funnel and an organic layer was separated. The organic layer was concentrated under reduced pressure to dryness. The residue was purified by reslurrying with methanol and a solid was separated. To the solid was added 10.0 g of toluene in drops and the solid was dissolved by heating. To the resulting solution was added methanol in drops at 65° C. over a period of 30 minutes to effect precipitation. Thereafter, the mixture was cooled to room temperature and a solid was recovered by filtration. The solid was washed with methanol and dried under reduced pressure to give 10.2 g of 1-(p-bromophenyl)-3,4,5-triphenylpyrazole.

Then, 7.59 g (0.049 mole) of p-nitrophenylhydrazine, 13.65 g (0.045 mole) of the 1,2,3-triphenylpropane-1,3-dione obtained above, and 112.5 g of toluene were placed in a 200-ml four-necked flask. The mixture was then heated under reflux with stirring for 20 hours. Upon completion of the reaction, the reaction mixture was cooled to room temperature and concentrated under reduced pressure to dryness. The residue was purified by reslurrying with methanol. A solid was recovered by filtration, washed with methanol, and dried under reduced pressure to give 10.8 g of 1-(p-nitrophenyl)-3,4,5-triphenylpyrazole.

In 200-ml four-necked flask were placed 10.8 g (0.026 mole) of the 1-(p-nitrophenyl)-3,4,5-triphenylpyrazole obtained above, 8.8 g (0.16 mole) of iron powder, 78.9 g of ethanol, and 0.45 g (0.004 mole) of concentrated hydrochloric acid. The mixture was then heated under reflux with stirring for 15 hours. Upon completion of the reaction, the reaction mixture was cooled to room temperature and concentrated under reduced pressure to dryness. To the residue was added 350.0 g of methylene chloride and the mixture was heated under reflux with stirring for 10 minutes. Thereafter, the mixture was cooled to room temperature and a solid was recovered by filtration. The filtrate was passed through a silica gel column and then concentrated under reduced pressure until crystals separated out. To the resulting slurry was added 10 g of hexane in drops, the mixture was stirred at room temperature, and a solid was recovered by filtration. The solid was washed with a 1:1 mixture of methylene chloride and hexane and dried under reduced to give 8.7 g of 1-(p-aminophenyl)-3,4,5-triphenylpyrazole.

The procedure of Synthetic Example 5 was followed with the exception of using 4.2 g (0.009 mole) of the 1-(p-bromophenyl)-3,4,5-triphenylpyrazole obtained above in place of 1-(p-bromophenyl)-3,5-diphenylpyrazole, 1.4 g (0.014 mole) of sodium tert-butoxide, 1.6 g (0.004 mole) of the 1-(p-aminophenyl)-3,4,5-triphenylpyrazole obtained above in place of aniline, 22.0 mg (0.10 millimole) of palladium acetate, 20 ml of xylene, and 0.20 ml of tri-tert-butylphosphine to give 3.6 g of tris[4-(3,4,5-triphenylpyrazol-1-yl)phenyl]amine (hereinafter referred to as TTPPA) as a white powder. The product showed a purity of 98.29% (area ratio, HPLC), a mass of 1128, and a melting point of 297.7° C. and corresponds to the compound listed as No. 151.

The sequence of reactions in Synthetic Example 8 is shown below.

[Chem 16]

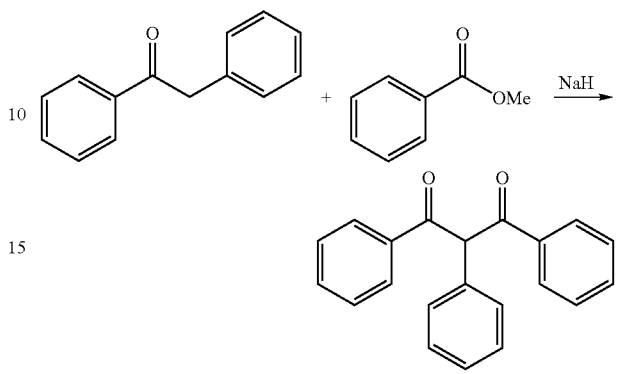

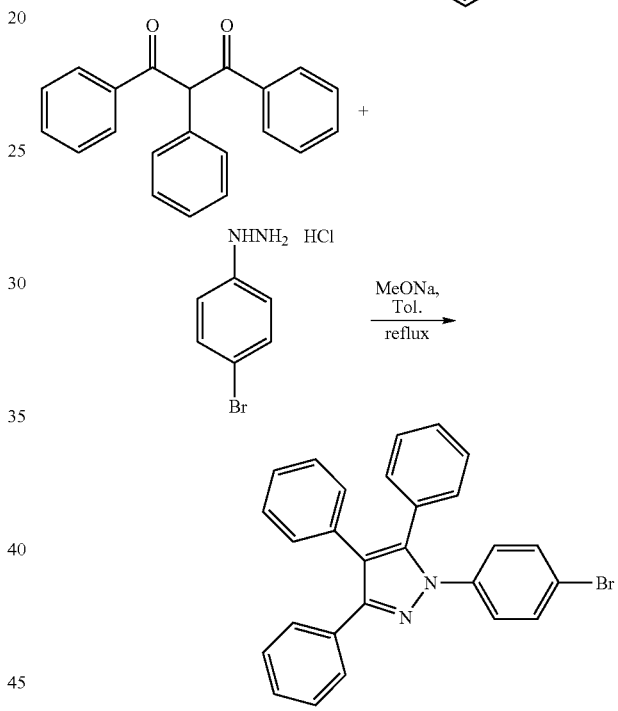

[Chem 17]

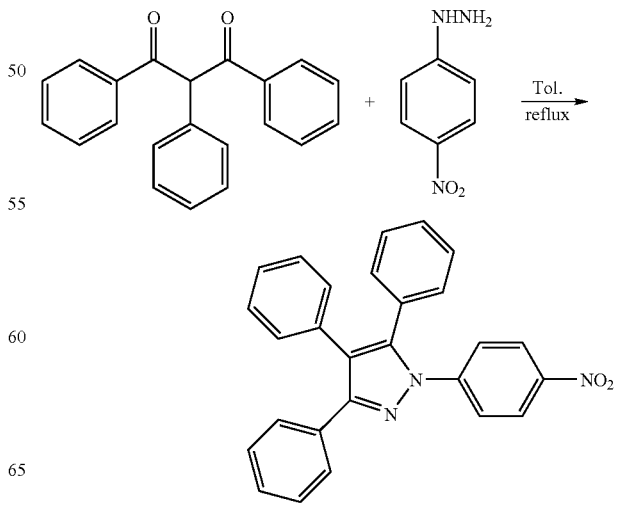

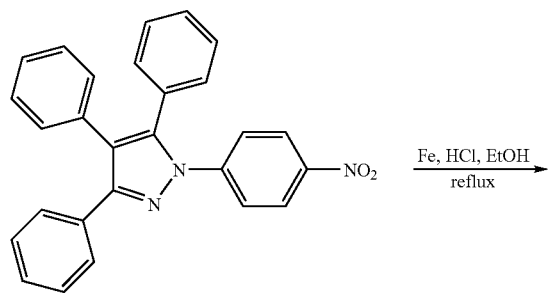

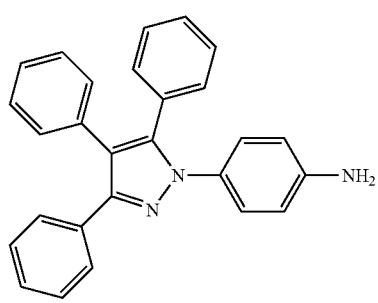

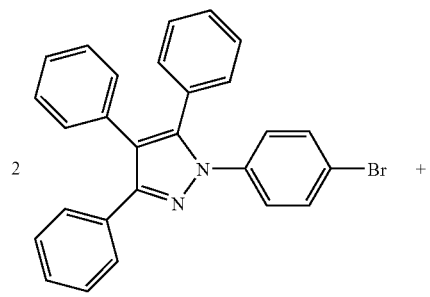

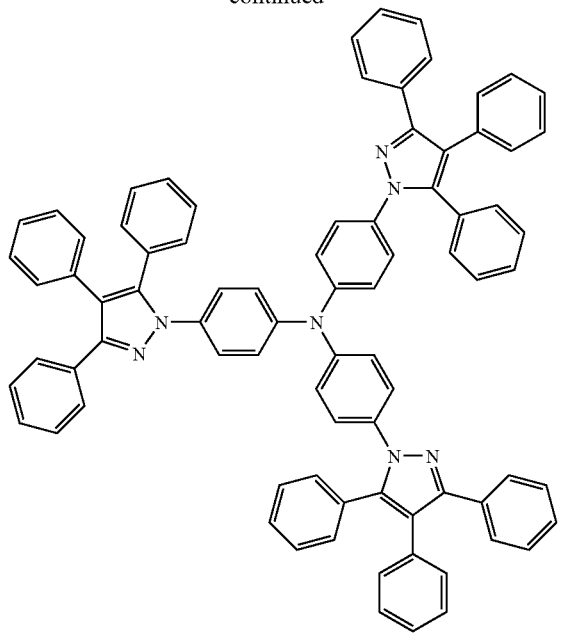

The results of the infrared analysis (KBr tablet technique) of TTPPA are shown below.

$cm^{-1}$: 3053, 3028, 1605, 1508, 1454, 1447, 1435, 1366, 1323, 1279, 1178, 970, 831, 781, 764, 729, 698

Synthetic Example 9

The procedure of Synthetic Example 5 was followed with the exception of using 4.62 g (0.012 mole) of 1-(p-bromophenyl)-3,5-diphenylpyrazole, 2.02 g (0.021 mole) of sodium tert-butoxide, 0.56 g (0.006 mole) of 4-aminopyridine in place of aniline, 10.8 mg (0.05 millimole) of palladium acetate, 25 ml of xylene, and 0.42 ml of tri-tert-butylphosphine to give 1.06 g of N,N-bis[4-(3,5-diphenylpyrazol-1-yl)phenyl]pyrid-4-ylamine (hereinafter referred to as BDPYA) as a white powder. This product was confirmed to be a single compound by TLCG analysis, showed a purity of 99.71% (area ratio, HPLC), a mass of 682, and a melting point of 133.8° C., and corresponds to the compound listed as No. 176.

The sequence of reactions in Synthetic Example 9 is shown below.

[Chem 18]

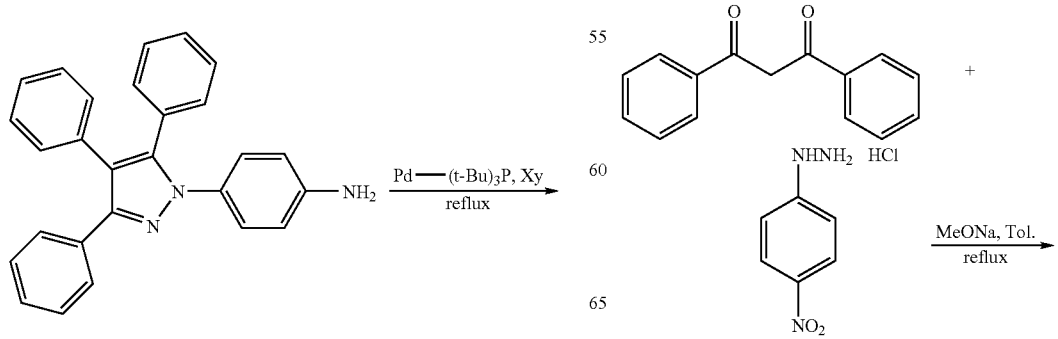

-continued

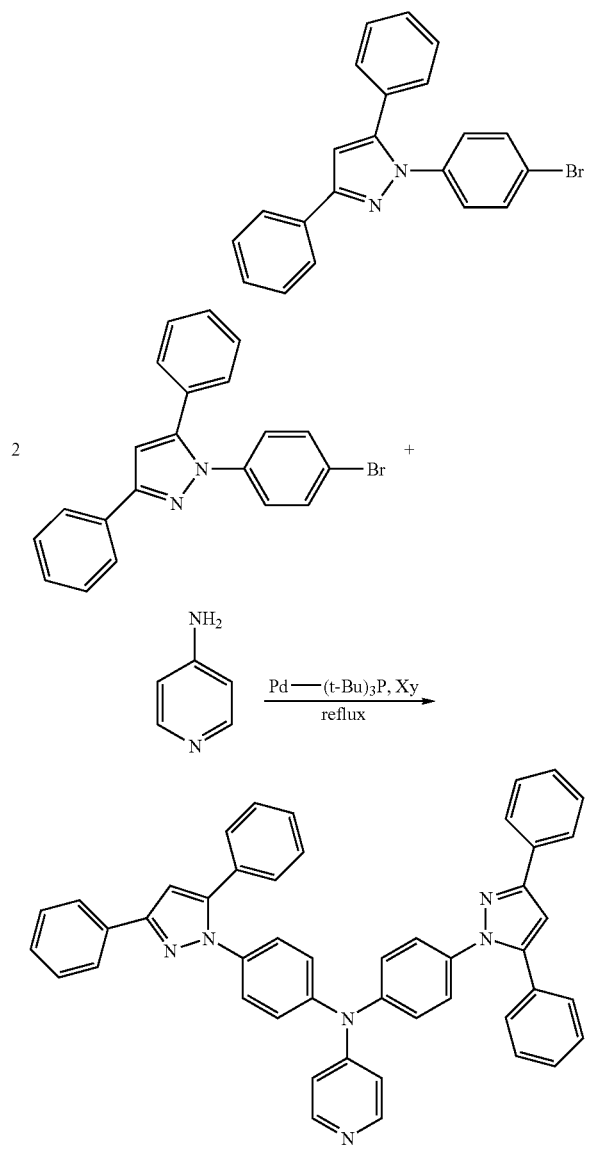

The results of the infrared analysis (KBr tablet technique) of BDPYA are shown below.

cm$^{-1}$: 3055, 3043, 1738, 1587, 1508, 1485, 1460, 1361, 1331, 1221, 972, 842, 761, 694

Supplementary Example 1

The glass transition temperature (Tg) of the compounds useful as candidates for the primary component of the light-emitting layer (host material) was determined by DSC to examine their heat-resistant properties. The compounds tested include the following known host materials: 3-phenyl-4-(1'-naphthyl)-5-phenyl-1,2,4-triazole as TAZ, 4,4'-N,N'-dicarbazolediphenyl as CBP, 2,9-dimethyl-4,7-diphenyl-1,10-phenanthroline as BCP, and 1,3-bis[(4-t-butylphenyl)-1,3,4-oxadiazolyl]phenylene as OXD-7. The results are shown in Table 15.

TABLE 15

| Host material | Glass transition temperature (Tg) (° C.) |
|---|---|
| BPP | 101 |
| α-BNP | 110 |
| β-BNP | 123 |
| BPPS | 109 |
| BDPPA | 92 |
| TDPPA | 132 |
| BDPPPA | 119 |
| TTPPA | 148 |
| BDPYA | 115 |
| TAZ | —[1] |
| CBP | —[1] |
| BCP | —[1] |
| OXD-7 | —[1] |

[1] Not observed because of high crystallinity

Supplementary Example 2

The stability of thin film of the host material was evaluated as follows. A film of the host material alone was formed on a glass substrate to a thickness of 100 nm by vacuum deposition. The film was kept at a temperature of 20° C. and a humidity of 30% and visually observed to determine the number of days the film required to start crystallizing. The results are shown in Table 16.

TABLE 16

| Host material | Number of days to start of crystallization |
|---|---|
| BPP | 42 days |
| α-BNP | 58 days |
| β-BNP | 63 days |
| BPPS | 67 days |
| BDPPA | 51 days |
| TDPPA | 71 days |
| BDPPPA | 68 days |
| TTPPA | 65 days |
| BDPYA | 52 days |
| TAZ | 7 days |
| CBP | 9 days |
| BCP | 4 days |
| OXD-7 | 3 days |

Example 1

An organic EL device having the layered structure shown in FIG. 1 less the hole-injecting layer 3 and the hole-blocking layer 6 was prepared as follows.

The anode was formed by patterning a 2 mm-wide stripe of a transparent conductive indium tin oxide (ITO) film (available from Sanyo Vacuum Industries Co., Ltd.) on the glass substrate 1, submitted to ultrasonic cleaning successively with a neutral detergent, ultrapure water, acetone, and isopropyl alcohol, dried by blowing with nitrogen, and finally submitted to ultraviolet/ozone cleaning, and placed in an apparatus for vacuum deposition.

The air was exhausted from the apparatus preliminarily by an oil rotary pump and then by an oil diffusion pump equipped with a liquid nitrogen trap until the degree of vacuum in the apparatus reached $(7-9) \times 10^{-4}$ Pa. The hole-transporting layer 4 was formed by heating 4,4'-bis[N,N'-(3-tolyl)amino]-3,3'-dimethylbiphenyl (hereinafter referred to as HMTPD) contained in a molybdenum boat and depositing the compound to a film thickness of 60 nm. On this layer was formed the light-emitting layer 5 by co-depositing BPP as the primary component and tris(2-phenylpyridine)iridium complex (hereinafter referred to as Ir(ppy)$_3$) as the phosphorescent organic metal complex from different evaporation sources to a film thickness of 25 nm. The concentration of Ir(ppy)$_3$ at this point was 7 wt %. Thereafter, a film of tris(8-hydroxyquinoline)aluminum (hereinafter referred to as Alq$_3$) with a thickness of 50 nm was formed as the electron-transporting layer 7.

The aforementioned device was taken out of the apparatus into the atmosphere, attached closely to a shadow mask in the form a 2 mm-wide stripe as a mask for vapor deposition of the cathode so that the stripe meets at right angles with the ITO stripe of the anode 2, and placed in another vacuum apparatus. The air was exhausted from the apparatus as in the formation of the organic layers and on the electron-transporting layer 7 were deposited lithium fluoride (LiF) to a film thickness of 0.5 nm as an electron-injecting layer and aluminum to a thickness of 170 nm as the cathode 8.

The organic electroluminescent device obtained in this manner was connected to an external power source and, when direct current voltage was applied, it exhibited the light-emitting characteristics shown in Table 17. The maximum wavelength of the emission spectrum was 512 nm and this confirmed that light was emitted from Ir(ppy)$_3$.

Example 2

An organic electroluminescent device was prepared as in Example 1 with the exception of using BDPYA as the primary component of the light-emitting layer.

The device thus obtained was connected to an external power source and, when direct current voltage was applied, it exhibited the light-emitting characteristics shown in Table 17. The maximum wavelength of the emission spectrum was 512 nm and this confirmed that light was emitted from Ir(ppy)$_3$.

Comparative Example 1

An organic electroluminescent device was prepared as in Example 1 with the exception of using TAZ as the primary component of the light-emitting layer. The properties of this device are shown in Table 17.

TABLE 17

|  | Color of emitted light | Current efficiency (cd/A) |
|---|---|---|
| Example 1 | Green | 30.2 |
| Example 2 | Green | 33.1 |
| Comparative example 1 | Green | 27.0 |

Examples 3-6

An organic electroluminescent device was prepared as in Example 1 with the exception of using a-BNP, β-BNP, BPPS, BDPPA, TDPPA, BDPPPA, or TIPPA as the primary component of the light-emitting layer. Each device thus prepared was connected to an external power source and, upon application of direct current voltage, showed the following maximum wavelength in the emission spectrum; 525 nm for a-BNP, 520 nm for β-BNP, 514 nm for BPPS, 515 nm for BDPPA, 520 nm for TDPPA, 515 nm for BDPPPA, and 520 nm for TTPPA. This confirmed that light was emitted from Ir(ppy)$_3$.

INDUSTRIAL APPLICABILITY

An organic electroluminescent device provided by this invention is applicable to a single device, a device arranged in array, or a device with the anode and the cathode arranged in the form of X-Y matrix. This organic electroluminescent device comprises a compound of specified skeleton and a phosphorescent metal complex in its light-emitting layer, shows higher luminous efficiency and better driving stability than the conventional devices utilizing light emission from the singlet state, and performs excellently when applied to full-color or multicolor panels.

What is claimed is:

1. An organic electroluminescent device comprising an anode, organic layers, and a cathode piled one upon another on a substrate wherein at least one of the organic layers is a light-emitting layer containing a host material and a dopant material and a compound represented by the following general formula II is used as said host material:

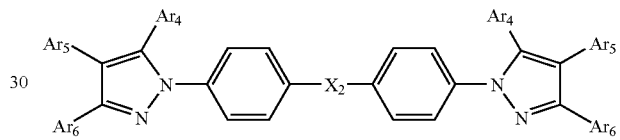

(II)

in formula (II), Ar$_4$ to Ar$_6$ are independently hydrogen or substituted or unsubstituted aromatic hydrocarbon groups or aromatic heterocyclic groups and at least one of them is a group other than hydrogen, X$_2$ is —O—, —S—, >CO—, >SO$_2$, >NAr$_7$, >SiAr$_8$Ar$_9$, and Ar$_7$ to Ar$_9$ are substituted or unsubstituted aromatic hydrocarbon groups or aromatic heterocyclic groups.

2. An organic electroluminescent device as described in claim 1 wherein X$_2$ is >NAr$_7$, or >SiAr$_8$Ar$_9$.

3. An organic electroluminescent device as described in claim 2 wherein X$_2$ is >NAr$_7$ or >SiAr$_8$Ar$_9$ and Ar$_7$ and at least one of Ar$_8$ and Ar$_9$ are substituted or unsubstituted aromatic heterocyclic groups.

4. An organic electroluminescent device described in claim 1 or 2 wherein the dopant material contains at least one metal complex selected from phosphorescent ortho-metalated metal complexes and porphyrin metal complexes.

5. An organic electroluminescent device as described in claim 4 wherein the central metal of the metal complexes is at least one metal selected from ruthenium, rhodium, palladium, silver, rhenium, osmium, iridium, platinum, and gold.

6. An organic electroluminescent device described in claim 1 wherein a hole-blocking layer is disposed between the light-emitting layer and the cathode.

7. An organic electroluminescent device described in claim 1 wherein an electron-transporting layer is disposed between the light-emitting layer and the cathode.

* * * * *